US009633685B2

(12) United States Patent
Kumar et al.

(10) Patent No.: US 9,633,685 B2
(45) Date of Patent: Apr. 25, 2017

(54) METHOD OF WRITING TO AN OPTICAL DATA STORAGE MEDIUM, METHOD OF READING FROM AN OPTICAL DATA STORAGE MEDIUM, AND OPTICAL DATA STORAGE MEDIUM

(71) Applicant: Agency for Science, Technology and Research, Singapore (SG)

(72) Inventors: Karthik Kumar, Singapore (SG); Kwang Wei Joel Yang, Singapore (SG); Huigao Duan, Singapore (SG); Mohamed Asbahi, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 220 days.

(21) Appl. No.: 14/039,044

(22) Filed: Sep. 27, 2013

(65) Prior Publication Data
US 2014/0092718 A1 Apr. 3, 2014

(30) Foreign Application Priority Data
Sep. 28, 2012 (SG) .................................. 201207248

(51) Int. Cl.
*B05D 5/12* (2006.01)
*H01L 21/302* (2006.01)
(Continued)

(52) U.S. Cl.
CPC ............ *G11B 7/0037* (2013.01); *B82Y 10/00* (2013.01); *B82Y 30/00* (2013.01); *G11B 7/0052* (2013.01);
(Continued)

(58) Field of Classification Search
CPC ................. G11B 7/24038; G11B 7/26; G11B 2007/0013; G11B 2007/24624;
(Continued)

(56) References Cited

U.S. PATENT DOCUMENTS 6,071,671 A * 6/2000 Glushko ............ G11B 7/00455
369/284
2006/0258163 A1* 11/2006 Ohashi .................. B81C 1/0046
438/735
(Continued)

FOREIGN PATENT DOCUMENTS

EP 2293298 A1 3/2011
EP 2461324 A1 6/2012
(Continued)

OTHER PUBLICATIONS

Kumar et al., "Printing Colour at the Optical Diffraction Limit," Nature Nanotechnology, vol. 7, Sep. 2012, pp. 557-561.
Mishima et al., "150 GB, 6-Layer Write Once Disc for Blu-ray Disc System," Optical Data Storage Topical Meeting, 2006, pp. 123-125.
Sarid et al., "A Roadmap for Optical Data Storage Applications," Optics and Photonics News, vol. 18, Issue 5, 2007, pp. 32-37.
(Continued)

*Primary Examiner* — Dionne H Pendleton
(74) *Attorney, Agent, or Firm* — Winstead, P.C.

(57) ABSTRACT

According to embodiments of the present invention, a method of writing to an optical data storage medium is provided. The method includes receiving a plurality of data elements, each data element having one of a plurality of values, wherein each value of the plurality of values is associated with a wavelength, and forming, for each data element, a nanostructure arrangement on the optical data storage medium, the nanostructure arrangement configured to reflect light of the wavelength associated with the value of the data element in response to a light irradiated on the optical data storage medium. According to further embodiments of the present invention, a method of reading from an optical data storage medium and an optical data storage medium are also provided.

18 Claims, 11 Drawing Sheets

(51) Int. Cl.
*G11B 7/0037* (2006.01)
*G11B 7/24035* (2013.01)
*B82Y 10/00* (2011.01)
*G11B 7/005* (2006.01)
*G11B 7/26* (2006.01)
*G11C 13/04* (2006.01)
*B82Y 30/00* (2011.01)
*G11B 5/855* (2006.01)
*G11B 7/1353* (2012.01)
*G11B 7/013* (2006.01)
*G11B 7/2433* (2013.01)

(52) U.S. Cl.
CPC ............ *G11B 7/24035* (2013.01); *G11B 7/26* (2013.01); *G11C 13/048* (2013.01); *G11B 5/855* (2013.01); *G11B 7/1353* (2013.01); *G11B 7/2433* (2013.01); *G11B 7/261* (2013.01); *G11B 7/266* (2013.01); *G11B 2007/0136* (2013.01); *Y10S 977/858* (2013.01); *Y10T 428/24802* (2015.01)

(58) Field of Classification Search
CPC . G11B 7/00455; G11B 7/005; G11B 7/00745; G11B 7/0938; G11B 7/24; G11B 7/24085; G11B 7/243; G11B 7/244; G11B 7/245; G11B 7/247; G11B 7/0065; G11B 7/24044; Y10S 977/858; Y10T 428/24802
See application file for complete search history.

(56) References Cited

U.S. PATENT DOCUMENTS

| | | | | |
|---|---|---|---|---|
| 2007/0041301 | A1* | 2/2007 | Kurt | B82Y 10/00 369/94 |
| 2008/0062796 | A1* | 3/2008 | Bates et al. | 365/216 |
| 2008/0260941 | A1* | 10/2008 | Jin | B01J 35/0013 427/126.4 |
| 2008/0268288 | A1* | 10/2008 | Jin | B81C 1/00031 428/800 |
| 2009/0147651 | A1* | 6/2009 | Prisacar | G11B 7/24044 369/100 |
| 2010/0232277 | A1* | 9/2010 | Matsuda | G11B 7/24035 369/100 |
| 2012/0062884 | A1* | 3/2012 | Sakagami | G01J 3/0224 356/301 |
| 2012/0068138 | A1 | 3/2012 | Fery et al. | |
| 2012/0156625 | A1* | 6/2012 | Chang | G03F 7/095 430/325 |

FOREIGN PATENT DOCUMENTS

WO 2011061107 A1 5/2011
WO 2013039454 A1 3/2013

OTHER PUBLICATIONS

Examination Report for Singapore Patent Application No. 2013073085 dated Dec. 10, 2014, pp. 1-10.
Search Report for Singapore Patent Application No. 2013073085 dated Dec. 10, 2014, pp. 1-8.

* cited by examiner

METHOD OF WRITING TO AN OPTICAL DATA STORAGE MEDIUM, METHOD OF READING FROM AN OPTICAL DATA STORAGE MEDIUM, AND OPTICAL DATA STORAGE MEDIUM

CROSS-REFERENCE TO RELATED APPLICATION

This application claims the benefit of priority of Singapore patent application No. 201207248-4, filed 28 Sep. 2012, the content of it being hereby incorporated by reference in its entirety for all purposes.

TECHNICAL FIELD

Various embodiments relate to an optical data storage layer, an optical data storage medium and an optical data storage assembly.

BACKGROUND

Optical data storage is widely used as an effective and permanent method of data storage. Using the current binary coding system, the smallest data structures that can be achieved with visible light has been achieved in the form of Blu-ray. The ability of creating 6-layer Blu-ray discs with a total capacity of 150 GB has been demonstrated.

It has also been reported that ultraviolet (UV) lasers have been used to read data, but presumably due to the incompatibility between UV and polymer based disks, this technology has not yet been brought to the market.

In addition, current research directions involve the use of near-field techniques such as near-field scanning optical microscopy, and exploiting the evanescent near field. Spot sizes are being reduced to the order of 50 nm. The major drawback of this method is the requirement to bring the substrate to within 10-25 nm of the read head, which would call the removability of the disc into question.

SUMMARY

According to an embodiment, a method of writing to an optical data storage medium is provided. The method may include receiving a plurality of data elements, each data element having one of a plurality of values, wherein each value of the plurality of values is associated with a wavelength, and forming, for each data element, a nanostructure arrangement on the optical data storage medium, the nanostructure arrangement configured to reflect light of the wavelength associated with the value of the data element in response to a light irradiated on the optical data storage medium.

According to an embodiment, a method of reading from an optical data storage medium is provided. The method may include irradiating a light on a plurality of nanostructure arrangements on the optical data storage medium, and for each nanostructure arrangement, determining the wavelength of the light reflected by the nanostructure arrangement and determining the value of a data element for the nanostructure arrangement based on the determined wavelength.

According to an embodiment, an optical data storage medium is provided. The optical data storage medium may include a substrate, and a plurality of spaced apart elongate nanostructures extending from a surface of the substrate, wherein each elongate nanostructure comprises a metal layer on the end distal from the surface of the substrate.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1A:
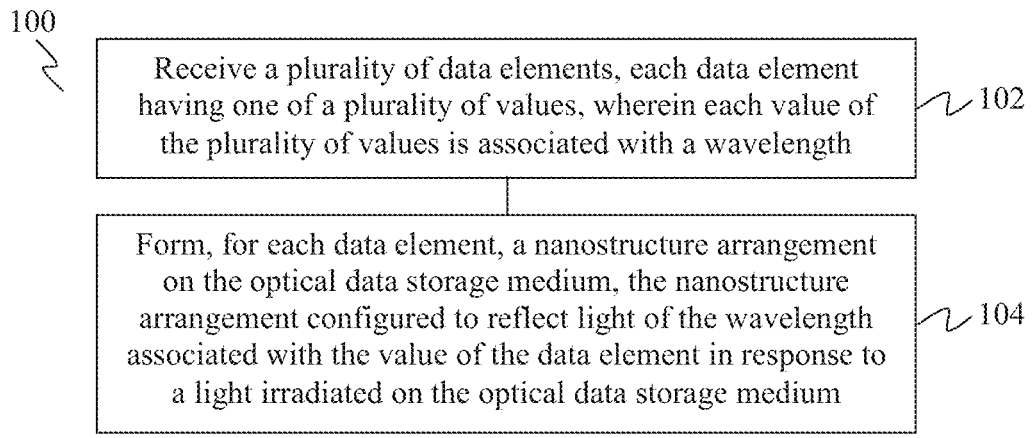
FIG. 1A shows a flow chart illustrating a method of writing to an optical data storage medium, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other method or device. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element includes a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

Various embodiments may relate to optical data storage, for example high density plasmonic optical data storage.

Various embodiments may provide a high density optical data storage disk/system that may hold up to 500 GB of data on the same area as a Blu-ray disc, with memory that may be accessed with minimal mechanical movement of the data storage system of various embodiments.

Various embodiments involve pushing the limit of colour-based far-field optical data storage by exploiting optical diffraction limit in the farfield. The optical diffraction limit is a term used to denote the minimum distance between 2 features (e.g. 2 colour pixels in various embodiments) that is necessary to be able to resolve these 2 features distinctly. The optical diffraction limit may be dependent on the equipment (e.g. 100× magnification and 0.9 numerical aperture objective) and the wavelength of light used (e.g. 500 nm, midspectrum wavelength), which in various embodiments, the optical diffraction limit may be approximately 250 nm. In various embodiments, metallic nanostructures may be defined to produce distinct color pixels at a pitch of about 250 nm. The metallic nanostructures may produce distinct colours as a result of plasmonic resonance, and therefore, each pixel may also be termed as a "plixel" (a combination of the words "plasmonic" and "pixel"). Each plixel may be individually resolved. Each plixel may represent a state for a data element. In various embodiments, as each data element may denote as many as 16 different states, an automatic four-time (4×) increase in data storage capacity may be achieved over conventional binary storage systems. In order to be able to distinguish each plixel, in addition to using white light instead of individual lasers as an irradiation source, a hyperspectral CCD may be coupled to the objective system (optical system) to distinguish the signal, generated in response to the white light, of each plixel individually.

Various embodiments provide implementation of plixels as individual data storage elements. Whereas currently each data storage element can only support 2 states, various embodiments may support multiple states, depending on the number of distinct colours that may be identified. Various embodiments may employ a white light source, instead of a laser source, in order to read the data on a disc or storage medium. As the data identification in various embodiments may be similar to the process of taking a photograph, the entire dataset of the disk may be easily read into a buffer very quickly. Hence there may be no or minimal time lag between acquisition and processing of data.

FIG. 1A shows a flow chart 100 illustrating a method of writing to an optical data storage medium, according to various embodiments.

At 102, a plurality of data elements may be received, each data element having one of a plurality of values, wherein each value of the plurality of values is associated with a wavelength. As a non-limiting example, the plurality of data elements may be received, for example, from a data source having data or information to be written to the optical data storage medium.

At 104, for each data element, a nanostructure arrangement is formed on the optical data storage medium, the nanostructure arrangement configured to reflect light of the wavelength associated with the value of the data element in response to a light irradiated on the optical data storage medium.

In other words, the method of writing to an optical data storage medium may include receiving a plurality of data elements, and determining a value of each data element. Each data element may take one value out of a plurality of possible values. Subsequently, based on the value associated with the data element, the method may include forming a nanostructure arrangement on the optical data storage medium, where in response to a light irradiated thereon, the nanostructure arrangement may reflect light of a wavelength which corresponds to the value of the data element defined by the nanostructure arrangement. In this way, during reading, the wavelength of the light reflected by the nanostructure arrangement may be determined so as to determine the value of the data element corresponding to the nanostructure arrangement.

In the context of various embodiments, each nanostructure arrangement may be configured to reflect light of the wavelength associated with the value of the data element in response to a white light irradiated on the optical data storage medium.

In the context of various embodiments, the term "wavelength" may include a wavelength range. In further embodiments, the value may also be associated with a colour or a colour spectrum.

In the context of various embodiments, the term "value" may be a determinant or a parameter that may provide an indication of the state of the data element. In this way, the value may represent the state of the data element to represent the data or information associated with the data element.

In various embodiments, each nanostructure arrangement may be an optical nanostructure arrangement.

In various embodiments, the plurality of values may be two such that the data element make take one out of two values. This may mean, for example, that one data element of the plurality of data elements may include a nanostructure arrangement configured to reflect a light of a first wavelength associated with a first value, while another data element of the plurality of data element may include another nanostructure arrangement configured to reflect a light of a second wavelength associated with a second value, where the first wavelength and the second wavelength are different wavelengths. In this way, for example, the reflected light of the first wavelength may represent a first state or information while the reflected light of the second wavelength may represent a second state or information. Therefore, two different states may be provided for the optical data storage medium. In this regard, a binary storage approach may be provided, where a data element may have a nanostructure arrangement configured to reflect a light of a particular wavelength to represent one out of two possible values or states.

In various embodiments, the plurality of values may be four such that the data element make take one out of four values. This may mean, for example, that four different types of nanostructure arrangements may be formed on the optical data storage medium, respectively configured to reflect light of a respective wavelength associated with a particular value of a data element, in response to a light irradiated on the optical data storage medium. Therefore, four different states may be provided for the optical data storage medium. In this regard, a quaternary (e.g. 4-ary) storage approach may be provided, where a data element may have a nanostructure arrangement configured to reflect a light of a particular wavelength to represent one out of four possible values or states.

In various embodiments, the plurality of values may be eight such that the data element make take one out of eight values. This may mean, for example, that eight different types of nanostructure arrangements may be formed on the optical data storage medium, respectively configured to reflect light of a respective wavelength associated with a particular value of a data element, in response to a light irradiated on the optical data storage medium. Therefore, eight different states may be provided for the optical data storage medium. In this regard, an 8-nary storage approach may be provided, where a data element may have a nanostructure arrangement configured to reflect a light of a particular wavelength to represent one out of eight possible values or states.

In various embodiments, the plurality of values may be sixteen such that the data element make take one out of sixteen values. This may mean, for example, that sixteen different types of nanostructure arrangements may be formed on the optical data storage medium, respectively configured to reflect light of a respective wavelength associated with a particular value of a data element, in response to a light irradiated on the optical data storage medium. Therefore, sixteen different states may be provided for the optical data storage medium. In this regard, an 16-nary storage approach may be provided, where a data element may have a nanostructure arrangement configured to reflect a light of a particular wavelength to represent one out of sixteen possible values or states.

In various embodiments, generally, the plurality of values may be n such that the data element make take one out of n values. This may mean, for example, that n different types of nanostructure arrangements may be formed on the optical data storage medium, respectively configured to reflect light of a respective wavelength associated with a particular value of a data element, in response to a light irradiated on the optical data storage medium. Therefore, n different states may be provided for the optical data storage medium. In this regard, an n-nary storage approach may be provided, where a data element may have a nanostructure arrangement configured to reflect a light of a particular wavelength to represent one out of n possible values or states.

Therefore, based on the above embodiments, the number of possible values that may be provided per data element may be increased. This may also mean that the number of possible states per data element may be increased.

In the context of various embodiments, in embodiments where each data element may have one of two possible values (e.g. binary), eight data elements may be grouped on the optical data storage medium to represent 1 Byte. For each of the embodiments where each data element may be provided with one of four, eight or sixteen possible states, eight data elements for these embodiments may occupy the same area/space as the area/space occupied for 1 Byte for the binary embodiment.

In various embodiments, arraying of 8 quaternary data elements (e.g. where each data element may take one out of four possible values) may result in 2 Bytes of data ($4^8$ states or 65536 states) in the same space occupied by 1 Byte of data ($2^8$ states) for the binary embodiment, providing double the amount of data as compared to the binary embodiment. Therefore, for embodiments having a quaternary system with 4 possible values, the amount of data may be twice as much in the same space as for the binary system.

In various embodiments, arraying of 8 data elements where each data element may take one out of eight possible values may result in 3 Bytes of data in the same space occupied by 1 Byte of data for the binary embodiment, providing triple the amount of data as compared to the binary embodiment. Therefore, for embodiments having an 8-ary system with 8 possible values, the amount of data may be three times as much in the same space as for the binary system.

In various embodiments having n possible values, the amount of data stored may be $[\ln(n)/\ln(2)]$ times the data stored for a binary system within the same space as the binary storage system.

In various embodiments, at 104, for forming the nanostructure arrangement for each data element, one or more spaced apart elongate nanostructures may be formed extending from a surface of a substrate of the optical data storage medium, and a metal layer may be formed on the end of each elongate nanostructure distal from the surface of the substrate. This may mean that the one or more spaced apart elongate nanostructures may be formed on a substrate, extending away from or above the surface of the substrate. In embodiments with a plurality of spaced apart elongate nanostructures, adjacent elongate nanostructures may be spaced apart, for example by a spacing or distance or gap, s. Each elongate nanostructure with the metal layer may be termed as a "metal nanostructure".

In the context of various embodiments, the term "nanostructure" may have a size in at least one dimension in the nanometer (nm) range, for example, a range between 1 nm and 500 nm, e.g. a range between 1 nm and 200 nm, a range between 1 nm and 100 nm, a range between 10 nm and 100 nm or a range between 50 nm and 100 nm.

In the context of various embodiments, the term "elongate" as applied to a nanostructure may mean a nanostructure that extends longitudinally, e.g. extending from a surface of the substrate on which the elongate nanostructure is formed.

In various embodiments, the one or more spaced apart elongate nanostructures may be arranged at least substantially vertically or perpendicularly to the surface of the substrate. However, it should be appreciated that any one or more or all of the elongate nanostructures may be arranged slightly angled to the surface, for example about 1° to 10° from an axis defined perpendicularly to the surface of the substrate.

Each elongate nanostructure has an end (i.e. proximal end) formed on the substrate, and includes a metal layer on an opposite end (i.e. distal end) away from the surface of the substrate. The one or more spaced apart elongate nanostructures may be formed directly on the surface on the substrate.

In the context of various embodiments, each elongate nanostructure may be or may include a nanopost. The term "nanopost" may include a reference to a nanocolumn, a nanorod, a nanotube, a nanopillar or the like.

In various embodiments, the height of each elongate nanostructure may be larger or smaller than the thickness of the metal layer on the end of each elongate nanostructure.

In various embodiments, the substrate may be a common substrate for the plurality of nanostructure arrangements.

In the context of various embodiments, each elongate nanostructure may have an aspect ratio greater than 0.25 (>0.25), e.g. between 0.25 and 20, between 0.25 and 10, between 0.25 and 4, between 0.25 and 2, between 1 and 20, between 1 and 4, or between 4 and 10, for example an aspect ratio of 0.25 where the length of the nanostructure is a quarter of the dimension of its width, an aspect ratio of 1, an aspect ratio of 2 where the length of the nanostructure is twice as much compared to its width, an aspect ratio of 5, an aspect ratio of 10, an aspect ratio of 20. It should be appreciated that the each elongate nanostructure may also have any higher aspect ratio more than 20. In the context of various embodiments, the term "aspect ratio" as applied to a nanostructure may mean a ratio of the length (or height) to the width (or cross sectional dimension) of the nanostructure. The length-to-width aspect ratio of the nanostructure represents the proportional relationship between its length and its width.

In the context of various embodiments, each elongate nanostructure may include a material including but not limited to an epoxy-based polymer (e.g. SU-8 photoresist), hydrogen silsesquioxane (HSQ), poly(methyl methacrylate) (PMMA), polycarbonate, titanium dioxide ($TiO_2$) or silicon oxide ($SiO_x$).

In the context of various embodiments, each elongate nanostructure may include a material having a refractive index of between about 1.3 and about 5, e.g. between about 1.3 and about 3, between about 1.3 and about 2, between about 2 and about 5, or between about 2 and about 3, e.g. a refractive index of about 1.3, about 2, about 3 or about 5. In addition, it should be appreciated that materials having a refractive index of more than 5 may also be used. In various embodiments, the material of each elongate nanostructure may depend on the material of the resist used to form the elongate nanostructure.

In various embodiments, each elongate nanostructure and its corresponding metal layer may form a plasmonic nanostructure. In the context of various embodiments, the one or more spaced apart elongate nanostructures and the layer of metal formed at the end of each elongate nanostructure (i.e. one or more plasmonic nanostructures) may co-operate by way of plasmonic resonance to produce colours in response to light (e.g. white light) irradiated on the optical data storage medium, depending on the respective nanostructure arrangement. A variety of colours or shades of colours of the visible or optical spectrum may be produced.

In the context of various embodiments, the term "plasmonic nanostructure" may mean or include a nanostructure having a metal layer on an end of the nanostructure, where both co-operate by way of plasmonic resonance such that a certain range of wavelengths of light in the visible range may be absorbed by the plasmonic nanostructure, thereby allowing the observation of the colour(s) reflected (i.e. not absorbed by the plasmonic nanostructure) from the plasmonic nanostructure.

In the context of various embodiments, the term "plasmonic resonance" may mean a behaviour or condition where a particular frequency (or wavelength) range of the incident wave (e.g. light) causes excitation of free electrons in a metal layer, which may cause a drop in the reflectivity of the metal layer as the energy of the incident wave (e.g. light), rather than being reflected by the metal layer and the plasmonic nanostructure, is coupled into plasmon modes. In the context of various embodiments, the plasmon modes may include surface plasmon modes which propagate along the surface of the metal layer or bulk plasmon modes which propagate inside the metal layer.

In various embodiments, at 104, for forming the nanostructure arrangement for each data element, another metal layer may be formed on portions of the surface of the substrate without the one or more spaced apart elongate nanostructures. For example, the other metal layer may be provided in the spacings or areas of the substrate between adjacent elongate nanostructures and/or at the edges/periphery of the substrate. Therefore, there may be nanoholes in this other metal layer where the bases of the elongate nanostructures may be located. In various embodiments, this other metal layer may act as a backreflector or retro-reflector to reflect light (e.g. white light) irradiated on the optical data storage medium onto the one or more spaced apart elongate nanostructures or plasmonic nanostructures to further enhance the colour absorption in the nanostructures.

In the context of various embodiments, the thickness of the metal layer on the end of each elongate nanostructure may be between about 5 nm and about 100 nm, e.g. between about 5 nm and about 50 nm, between about 5 nm and about 20 nm, between about 20 nm and about 100 nm or between about 20 nm and about 50 nm, for example a thickness of about 5 nm, about 20 nm, about 50 nm or about 100 nm.

In the context of various embodiments, the thickness of the other metal layer on portions of the surface of the substrate without the one or more spaced apart elongate nanostructures may be the same as the thickness of the metal layer on the end of each elongate nanostructure.

In the context of various embodiments, the metal layer on the end of each elongate nanostructure and/or the other metal layer may include a noble metal.

In the context of various embodiments, the metal layer and/or the other metal layer may include but not limited to any one of or a combination of gold (Au), silver (Ag), copper (Cu), aluminium (Al), chromium (Cr), ruthenium (Ru), rhodium (Rh), palladium (Pd), osmium (Os), iridium (Ir) or platinum (Pt). It should be appreciated that other metals may be used. In various embodiments, different colours may be reflected from the nanostructure arrangements 104 depending on the material of the metal layer and/or the material of the other metal layer.

In the context of various embodiments, the metal layer and the other metal layer may be of the same or different metals.

In various embodiments, at 102, at least two data elements having different values may be received, and at 104, for each data element of the at least two data elements, the method may include forming one or more spaced apart elongate nanostructures having a cross sectional dimension, d, defined along a transverse axis of the elongate nanostructures that is different from the one or more spaced apart elongate nanostructures of the nanostructure arrangements of the other of the at least two data elements. In this way, by controlling the cross sectional dimension, d, light of a particular wavelength may be reflected, such that elongate nanostructures having different cross sectional dimensions, d, may result in respective lights of different wavelengths being reflected. In the context of various embodiments, the term "transverse axis" may mean an axis perpendicular to the longitudinal axis of the elongate nanostructure.

In various embodiments, the cross sectional dimension, d, may be between about 10 nm and about 250 nm, e.g. between about 10 nm and about 200 nm, between about 10 nm and about 100 nm, between about 10 nm and about 50 nm, between about 100 nm and about 250 nm, or between about 50 nm and about 200 nm, for example a cross sectional dimension of about 10 nm, about 50 nm, about 100 nm or about 250 nm. In various embodiments, different colours may be reflected from the nanostructure arrangements depending on the cross sectional dimensions of the one or more spaced apart elongate nanostructures.

In various embodiments, at 102, at least two data elements having different values may be received, and at 104, for each data element of the at least two data elements, the method may include forming a nanostructure arrangement for each data element comprises forming, for each data element of the at least two data elements, a plurality of spaced apart elongate nanostructures having a spacing, s, between adjacent elongate nanostructures of the plurality of elongate nanostructures that is different from the plurality of spaced apart elongate nanostructures of the nanostructure arrangements of the other of the at least two data elements. In this way, by controlling the spacing, s, light of a particular wavelength may be reflected, such that elongate nanostructures having different spacings, s, may result in respective lights of different wavelengths being reflected.

In various embodiments, the adjacent elongate nanostructures may be spaced apart by a distance, s, of between about 20 nm and about 300 nm, e.g. between about 20 nm and about 200 nm, between about 20 nm and about 100 nm, between about 20 nm and about 50 nm, between about 50 nm and about 300 nm, or between about 100 nm and about 200 nm, for example a spacing of about 20 nm, about 50 nm, about 100 nm or about 200 nm. In various embodiments, different colours may be reflected from the nanostructure arrangements 104 depending on the spacings, s.

In the context of various embodiments, a plurality of spaced apart elongate nanostructures may have a periodicity (or pitch) of (d+s) that is at least substantially the same. The periodicity may be between about 30 nm and about 550 nm, e.g. between about 30 nm and about 300 nm, between about 30 nm and about 100 nm, between about 50 nm and about 200 nm, between about 100 nm and about 550 nm, or between about 100 nm and about 200 nm, for example a periodicity of about 30 nm, about 50 nm, about 120 nm, about 200 nm, about 300 nm or about 550 nm.

In various embodiments, each elongate nanostructure may have an asymmetrical cross sectional shape defined along a transverse axis of the elongate nanostructure. For example, each asymmetrical elongate nanostructure may have a cross sectional shape in the form of a rod, an ellipse, a rectangle, or any asymmetrical polygonal shapes. By forming asymmetrical elongate nanostructures, the associated nanostructure arrangement may be polarization sensitive.

In various embodiments, each elongate nanostructure may have an at least substantially symmetrical cross sectional shape defined along a transverse axis of the elongate nanostructure. For example, each symmetrical elongate nanostructure may have a cross sectional shape in the form of a disk, a circle, a square, or any symmetrical polygonal shapes.

In various embodiments, the metal layer on the end of each elongate nanostructure may have a cross sectional shape and/or a cross sectional dimension that is at least substantially the same as that of the corresponding elongate nanostructure.

In various embodiments, a plurality of spaced apart elongate nanostructures may be formed, arranged in a grid-like pattern (e.g. in columns and rows). As non-limiting examples, the plurality of spaced apart elongate nanostructures may be arranged in a 2×2, 3×3, 4×4, 8×8, 10×10 or 20×20 grid-like pattern.

In various embodiments, each nanostructure arrangement may have a size of between about 250 nm×250 nm (area of about 0.0625 $\mu m^2$) and about 2.5 $\mu m$×2.5 $\mu m$ (area of about 6.25 $\mu m^2$), for example between about 250 nm×250 nm and about 1 $\mu m$×1 $\mu m$, between about 250 nm×250 nm and about 500 nm×500 nm, between about 250 nm×250 nm and about 375 nm×375 nm, or between about 375 nm×375 nm and about 1.5 $\mu m$×1.5 $\mu m$.

In various embodiments, one or more respective nanostructure arrangements may have a size of about 250 nm×250 nm having 2×2 spaced apart elongate nanostructures arranged in a grid-like pattern (e.g. in 2 columns and 2 rows).

In various embodiments, one or more respective nanostructure arrangements may have a size of about 375 nm×375 nm having 3×3 spaced apart elongate nanostructures arranged in a grid-like pattern.

In various embodiments, one or more respective nanostructure arrangements may have a size of about 2.5 $\mu m$×2.5 $\mu m$ having 20×20 spaced apart elongate nanostructures arranged in a grid-like pattern.

In the context of various embodiments, each nanostructure arrangement may include between one elongate nanostructure and 400 spaced apart elongate nanostructures.

In the context of various embodiments, a height of each elongate nanostructure may be between about 10 nm and about 500 nm, e.g. between about 10 nm and about 300 nm, between about 10 nm and about 100 nm, between about 10 nm and about 50 nm, between about 100 nm and about 500 nm or between about 100 nm and about 200 nm, for example a height of about 10 nm, about 50 nm, about 100 nm, about 300 nm or about 500 nm.

In various embodiments, a writing apparatus for writing to an optical data storage medium may be provided. The writing apparatus may include a receiving circuit configured to receive a plurality of data elements, each data element having one of a plurality of values, wherein each value of the plurality of values is associated with a wavelength, and a writer (or a forming module) configured to form, for each data element, a nanostructure arrangement on the optical data storage medium, the nanostructure arrangement configured to reflect light of the wavelength associated with the value of the data element in response to a light irradiated on the optical data storage medium. The writing apparatus may be configured to perform the method of writing to an optical data storage medium as described above.

Figure 1B:
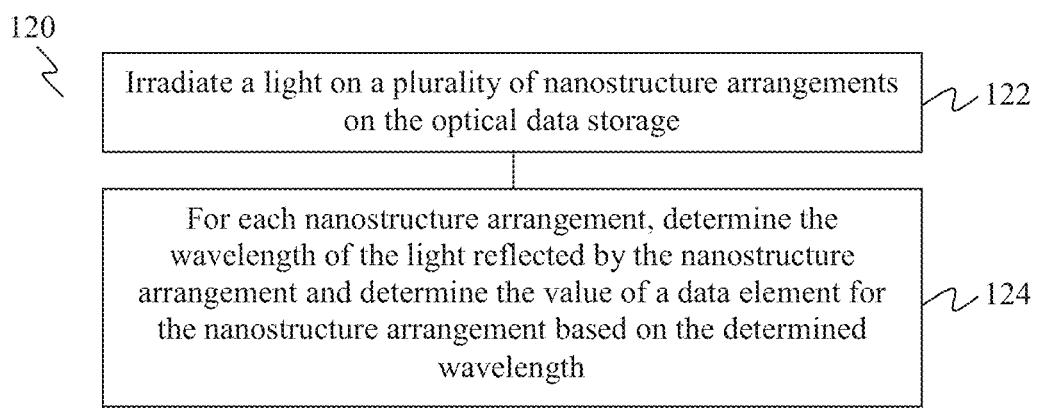
FIG. 1B shows a flow chart illustrating a method of reading from an optical data storage medium, according to various embodiments.

FIG. 1B shows a flow chart 120 illustrating a method of reading from an optical data storage medium, according to various embodiments.

At 122, a light is irradiated on a plurality of nanostructure arrangements on the optical data storage medium. In various embodiments, a white light may be irradiated on the plurality of nanostructure arrangements.

At 124, for each nanostructure arrangement, the wavelength of the light reflected by the nanostructure arrangement is determined and the value of a data element for the nanostructure arrangement is determined based on the determined wavelength.

In other words, in order to read the optical data storage medium, an incident light may be provided onto the plurality of nanostructure arrangements on the optical data storage medium. Subsequently, the light reflected by each nanostructure arrangement, in response to the incident light may be collected or detected. A wavelength of the light reflected by the nanostructure arrangement may then be determined and from the wavelength of the reflected light that has been determined, the value of a data element for the nanostructure arrangement may be determined.

In various embodiments, the light reflected by the nanostructure arrangement may be focused prior to determining the wavelength of the light. This may be achieved for example via an objective lens.

In various embodiments, the method may further include separating the respective lights reflected by the plurality of nanostructure arrangements prior to determining the wavelength of the light reflected by each nanostructure arrangement. This may mean that the respective lights that are reflected may be spatially separated. As the reflected lights are separated, there is less overlapping of the reflected lights which otherwise may cause challenges in determining the respective wavelength of each respective reflected light. As a non-limiting example, a grating may be employed to separate the respective reflected lights.

In various embodiments, a reading apparatus for reading from an optical data storage medium may be provided. The reading apparatus may include a light source configured to irradiate a light on a plurality of nanostructure arrangements on the optical data storage medium, and a reader configured, for each nanostructure arrangement, to determine the wavelength of the light reflected by the nanostructure arrangement and to determine the value of a data element for the nanostructure arrangement based on the determined wavelength. The reading apparatus may be configured to perform the method of reading from an optical data storage medium as described above.

In various embodiments, the light source may be a white light source configured to generate a white light for irradiation of the plurality of nanostructure arrangements on the optical data storage medium.

In various embodiments, the reader may include a detector (e.g. a hyperspectral charge-coupled device (CCD)) for determining the wavelength of the light reflected by the nanostructure arrangement. In various embodiments, the reader may include a processor (or processing circuit), or the detector itself, configured to determine the value of the data element for the nanostructure arrangement based on the determined wavelength.

In various embodiments, the reader may further include an objective lens configured to focus the light reflected by the nanostructure arrangement. For example, the objective lens may focus the reflected light onto the detector. The objective lens may be arranged in an optical path between the optical data storage medium and the detector. In various embodiments, the objective lens may have a numerical aperture (NA) of between about 0.7 and about 1.0, for example between 0.90-0.95. However, there may be challenges in resolving the reflected lights of different wavelengths using an objective lens with an NA of less than about 0.90. In various embodiments, the objective lens may have a magnification factor of between about 100 and about 150.

In various embodiments, the reader may further include a grating configured to separate the respective reflected lights, for example to spatially separate the respective reflected lights. The grating may be arranged in an optical path between the optical data storage medium and the detector, for example, the grating may be arranged in an optical path between the objective lens and the detector. In various embodiments, the grating may be a fine grating.

Figure 1C:
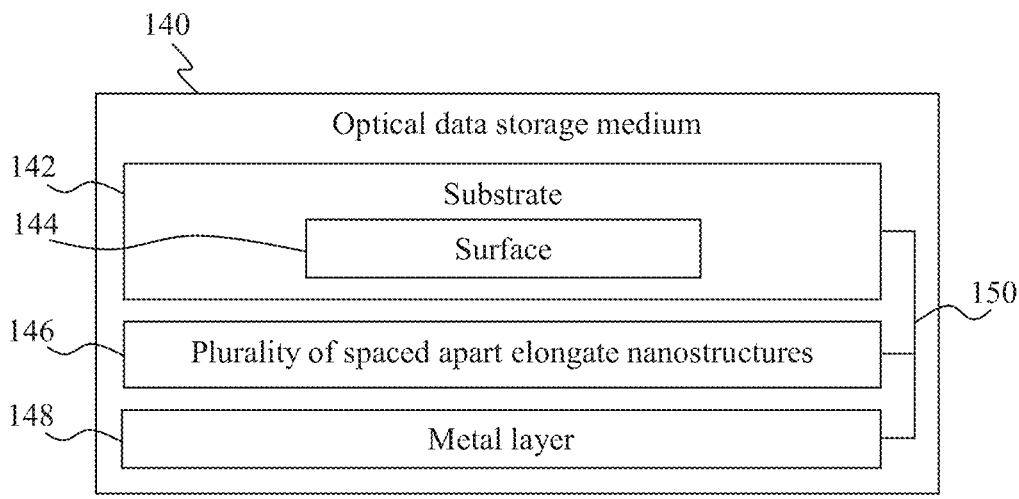
FIG. 1C shows a schematic block diagram of an optical data storage medium, according to various embodiments.

FIG. 1C shows a schematic block diagram of an optical data storage medium 140, according to various embodiments. The optical data storage medium 140 may include a substrate 142, and a plurality of spaced apart elongate nanostructures 146 extending from a surface 144 of the substrate 142, wherein each elongate nanostructure 146 includes a metal layer 148 on the end distal from the surface 144 of the substrate 142.

In other words, the optical data storage medium 140 includes a plurality of spaced apart elongate nanostructures 146 on the substrate 142, which extend away from or above the surface 144 of the substrate 142. Adjacent elongate nanostructures 146 are spaced apart, for example by a spacing or distance or gap, s.

The plurality of elongate nanostructures 146 may be arranged at least substantially vertically or perpendicularly to the surface 144. However, it should be appreciated that any one or more or all of the plurality of spaced apart elongate nanostructures 146 may be arranged slightly angled to the surface 144, for example about 1° to 10° from an axis defined perpendicularly to the surface 144.

Each elongate nanostructure 146 has an end (i.e. proximal end) formed on the substrate 142, and includes a metal layer 148 on an opposite end (i.e. distal end) away from the surface 144 of the substrate 142. The plurality of spaced apart elongate nanostructures 146 may be formed directly on the surface 144 on the substrate 142.

In various embodiments, the substrate 142 and the plurality of spaced apart elongate nanostructures 146 with the corresponding metal layers 148 may be formed as an optical data storage layer. In various embodiments, the optical data storage medium 140 may include one or more spaced apart optical data storage layers, for example one, two, three, four, five, six or any higher number of optical data storage layers.

In various embodiments, an optical data storage medium may be provided. The optical data storage medium may include a plurality of nanostructure arrangements, each nanostructure arrangement defining a data element having one of a plurality of values, wherein each nanostructure arrangement is configured to reflect light of a wavelength associated with the value of the data element in response to a light (e.g. white light) irradiated on the optical data storage medium. In various embodiments, each nanostructure arrangement may include a substrate, and one or more spaced apart elongate nanostructures extending from a surface of the substrate, wherein each elongate nanostructure includes a metal layer on the end distal from the surface of the substrate. In various embodiments, the substrate may be a common substrate for the plurality of nanostructure arrangements.

In the context of various embodiments, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC)

processor). A "circuit" may also be a processor executing software, e.g. any kind of computer program, e.g. a computer program using a virtual machine code such as e.g. Java. Any other kind of implementation of the respective functions which will be described in more detail below may also be understood as a 'circuit' in accordance with an alternative embodiment.

It should be appreciated that elements or structures of the optical data storage medium, e.g. nanostructure arrangement, elongate nanostructure, as described above in the context of any one of the embodiments of the writing method, the writing apparatus, the reading method, the reading apparatus or the optical data storage medium, may be applicable also to the other embodiment(s).

In the context of various embodiments, it should be appreciated that the cross sectional dimension, and/or the cross sectional shape of an elongate nanostructure, and/or the spacing (or pitch) of adjacent elongate nanostructures, and/or the material of the metal layer on an end of the elongate nanostructure, and therefore also of the plasmonic nanostructures, may be changed depending on the colour to be produced or wavelength of the light to be reflected from the respective nanostructure arrangement. In other words, the colour or light of a particular wavelength or wavelength range that is produced or reflected by a plasmonic nanostructure may depend on its cross sectional dimension and/or its cross sectional shape and/or its distance from another plasmonic nanostructure and/or the metal layer of the plasmonic nanostructure or a combination of any two, three or all of these features.

In the context of various embodiments, the optical data storage medium (e.g. 140) may be an optical disc.

In the context of various embodiments, the optical data storage medium (e.g. 140) may be a plasmonic optical data storage medium.

As described above, various embodiments may be provided for colour-based far-field optical data storage.

Various embodiments may provide nanostructure arrangements that may achieve a range of different colours on a microscopic length scale. In various embodiments, the variation in colours may be obtained by tuning the plasmonic resonances of the nanostructures by changing, for example, the sizes and/or the shapes and/or the spacings of the nanostructures. When the nanostructure arrangement is irradiated with light, these plasmonic resonances determine the colour(s) of light that is absorbed by the nanostructures, thereby allowing a range of different colours to be reflected and hence observable or detectable. Therefore, colour information may be encoded in the dimensional parameters and/or shapes and/or positions of metal nanostructures (e.g. nanostructures having a layer of metal on an end of each nanostructure), so that tuning of the plasmon resonance of the nanostructures may determine the colours of the individual pixels formed by the respective nanostructure arrangement.

Various embodiments may employ the use of colour pixels juxtaposed at a pitch of about 250 nm as a means for the optical storage of data. Various embodiments may enable major improvements to the current benchmark of optical data storage technology, e.g. Blu-ray, by introducing the concept of using colour spectra as the data signal to be read out.

Various embodiments may employ the use of metal nanostructures (e.g. where each nanostructure has a layer of metal on an end thereof) to achieve colour pixels, where each metal nanostructure may be a plasmonic nanostructure. Each pixel may be defined by a nanostructure arrangement having a single metal nanostructure or a cluster of metal nanostructures, for displaying different colours, as a result of plasmonic resonance. Each pixel may also be termed as a "plixel" (a combination of the words "plasmonic" and "pixel"), made up of one or more plasmonic nanostructures. In various embodiments, by patterning nanostructures with different diameters and/or gaps, and subsequently depositing one or more thin layers of metal onto each nanostructure, a large variation in the colours observable may be achieved, possibly spanning at least substantially the entire visible spectrum. Each of the colours observable may have a different colour spectrum which may be measured using a microspectrophotometer.

Figure 2:
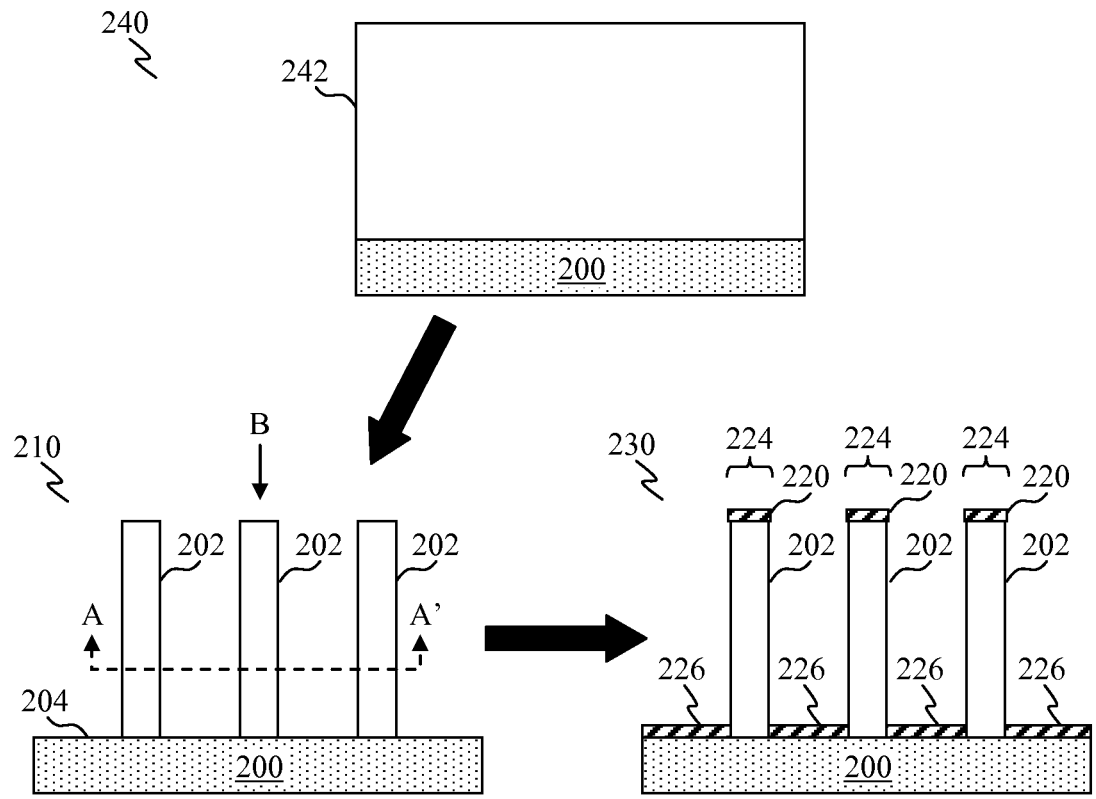
FIG. 2 shows, as cross-sectional views, various processing stages of a method of forming a nanostructure arrangement, according to various embodiments.

FIG. 2 shows, as cross-sectional views, various processing stages of a method of forming a nanostructure arrangement, according to various embodiments. The method may allow bright-field colours to be produced using plasmonic resonances in the nanostructures of the nanostructure arrangements. The nanostructure arrangement and the resulting colours may be observable using bright-field illumination.

A substrate (e.g. a silicon (Si) substrate) 200 is first provided. A resist material may then be spin-coated on the substrate 200 to obtain a resist layer of a desired thickness on the substrate 200. FIG. 2 shows a structure or arrangement 240 that may be obtained, with a resist layer 242 spin-coated on the substrate 200.

A plurality or array of elongate nanostructures or high aspect ratio nanostructures (e.g. aspect ratio >0.25), for example nanoposts, of a sufficient length/height (e.g. about 100 nm) may then be lithographically defined on the substrate 200 and subsequently developed. The plurality of elongate nanostructures may be spaced apart. FIG. 2 shows a structure or nanostructure arrangement 210 that may be obtained, where the nanostructure arrangement 210 includes a plurality of spaced apart elongate nanostructures 202 formed on the substrate 200. The plurality of elongate nanostructures 202 extend from a surface 204 of the substrate 200. The plurality of elongate nanostructures 202 may extend at least substantially vertically to the surface 204, i.e. extend perpendicularly to the surface 204.

A thin layer of metal (e.g. a noble metal, e.g. gold (Au), or a combination of silver (Ag) and gold (Au), Ag/Au), for example having a thickness of about 20 nm, may then be deposited at an end of each elongate nanostructure 202 of the array of elongate nanostructures 202, on top of each elongate nanostructure 202 on the end distal from the surface 204 of the substrate 200.

At the same time of depositing the thin metal layer on the plurality of elongate nanostructures 202, a layer of the same metal, for example having a thickness of about 20 nm, may also be deposited at portions of the surface 204 of the substrate 200 without the plurality of elongate nanostructures 202, including the spaces in between adjacent elongate nanostructures 202. Therefore, a single step may be performed to deposit a blanket metal layer over the nanostructure arrangement 210, thereby covering the top ends of the plurality of elongate nanostructures 202, and the portions of the surface 204 of the substrate 200 without the plurality of elongate nanostructures 202. Alternatively, a separate step may be performed to deposit the metal layer at portions of the surface 204 of the substrate 200 without the plurality of elongate nanostructures 202.

FIG. 2 shows a structure or nanostructure arrangement 230 that may be obtained after the step of thin metal deposition. The nanostructure arrangement 230 includes a plurality of spaced apart elongate nanostructures 202 formed on the substrate 200 and a layer of metal 220 deposited on top of each elongate nanostructure 202 at the end of each elongate nanostructure 202 distal from the substrate 200. Each elongate nanostructure 202 with the layer of metal 220 may form a metal nanostructure 224 or a plasmonic nanostructure 224. The nanostructure arrangement 230 further includes a layer of metal 226 deposited at portions of the surface 204 of the substrate 200 without the plurality of elongate nanostructures 202. The metal layer 226 acts as a backreflector to reflect light irradiated on the nanostructure arrangement 230 onto the plurality of metal nanostructures 224 or plasmonic nanostructures 224. The metal layer 220 and the metal layer 226 may be discontinuous from each other, meaning that the metal layer 220 and the metal layer 226 are not electrically coupled to each other, and therefore are electrically isolated from each other. This may mean that no metal layer may be formed on the sidewall of each elongate nanostructure 202. In addition, each metal layer 220 may be electrically isolated from another metal layer 220 of another elongate nanostructure 202.

In various embodiments, during the lithography process, elongate nanostructures 202 with the same or different cross sectional dimensions and/or cross sectional shapes, where the cross section is defined as a plane along the line A-A' (i.e. the cross section of each elongate nanostructure 202 as seen in the direction B), may be patterned and formed. In this way, all of the plurality of elongate nanostructures 202 may have the same cross sectional dimensions and/or cross sectional shapes, or some of the plurality of elongate nanostructures 202 may have different cross sectional dimensions and/or cross sectional shapes compared to the others. Therefore, the plurality of elongate nanostructures 202 may have different cross sectional shapes, for example, one or more elongate nanostructures 202 may have a circular cross section, one or more elongate nanostructures 202 may have a rectangular cross section and one or more elongate nanostructures 202 may have a triangular cross section. In addition, the plurality of elongate nanostructures 202 may have different cross sectional dimensions, for example, one or more elongate nanostructures 202 may have a cross sectional dimension d1, one or more elongate nanostructures 202 may have a cross sectional dimension d2 and one or more elongate nanostructures 202 may have a cross sectional dimension d3.

Furthermore, elongate nanostructures 202 with the same or different distances/spacings, s, between adjacent elongate nanostructures 302 (or alternatively the pitch, defined as the distance between the centre points of adjacent elongate nanostructures 202) may be patterned and formed. In this way, all of the plurality of elongate nanostructures 202 may have the same pitch, or some of the plurality of elongate nanostructures 202 may have the same pitch, but that is different to the pitch of some other elongate nanostructures 202. As a result, elongate nanostructures 202 may be patterned and formed with the same or different areal densities on the substrate 200. For example, some elongate nanostructures 202 at one area of the substrate 200 may have a pitch p1 (or spacing, s1) while some elongate nanostructures 202 at another area of the substrate 200 may have a pitch p2 (or spacing, s2).

In various embodiments, any one, two or all of the cross sectional dimension and/or the cross sectional shape and/or the spacing and/or the pitch may be varied for the plurality of elongate nanostructures 202.

Therefore, the plurality of elongate nanostructures 202, and therefore also the plurality of plasmonic nanostructures 224, may be arranged according to the colour(s) to be produced or reflected from the plurality of plasmonic nanostructures 224. For example, the plurality of plasmonic nanostructures 224 may be formed in regions of the substrate 200 where colours are to be observed, where the regions may be of any shapes and/or sizes and/or at different portions of the substrate 200.

In various embodiments, the process(es) for depositing the metal layers 220, 226 may include electron beam evaporation in which an electron beam is directed and focused on a target material to be deposited until the material evaporates and its vapour deposits over the plurality of elongate nanostructures 202 and/or the surface 204 of the substrate 200 to deposit the metal layers 220, 226.

In various embodiments, the height (length) of the elongate nanostructures (e.g. nanoposts) 202 may be larger than the thickness of the metal layers 220 on the top of the elongate nanostructures 202, such that the metal layers 220 may be considered as isolated plasmonic metal nanodisks displaying plasmonic resonance behavior. Plasmon resonance results in the extinction of a certain range of wavelengths of light in the visible range, for example by being absorbed by the plasmonic nanostructures 224, thereby allowing the observation of the colours reflected from the plasmonic nanostructures 224. By changing the size or cross sectional dimension of the elongate nanostructures 202, other corresponding wavelengths may be extinguished as a result of a change in the plasmonic resonance, thereby resulting in different colours being reflected and observed. In addition, by changing the areal density of the elongate nanostructures 202 on the substrate 200, the colours and the intensity of the colours observed may be changed accordingly. Furthermore, in various embodiments, the metal layer 226 on portions of the surface 204 without an elongate nanostructure 202 (e.g. spaces in between elongate nanostructures 202) may act as retro-reflectors that may further enhance the colour absorption in the plasmonic nanostructures 224.

Figure 3:
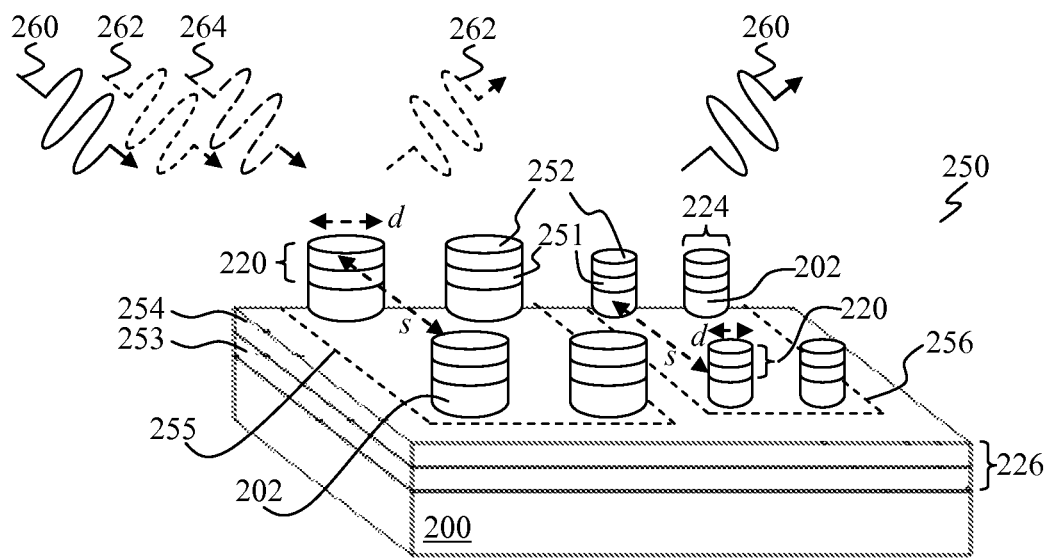
FIG. 3 shows a perspective view of a nanostructure arrangement that may be obtained from the method illustrated in FIG. 2, according to various embodiments.

In various embodiments, the scattering strength of particle resonators may be increased by raising them above a metal backreflector to obtain 250 nm-pitch pixels or plixels that may reflect individual colours without a dependence on periodicity. FIG. 3 shows a perspective view of a nanostructure arrangement 250 that may be obtained from the method illustrated in FIG. 2, according to various embodiments, for two such plixels.

The nanostructure arrangement 250 includes a substrate 200 and a plurality of spaced apart elongate nanostructures (e.g. nanoposts) 202 formed on the substrate 200. Each elongate nanostructure 202 includes a metal layer 220 (e.g. metal nanodisk) deposited on top of each elongate nanostructure 202 at the end of each elongate nanostructure 202 distal from the substrate 200. As a non-limiting example, the metal layer 220 may include a layer of silver (Ag) 251, and a layer of gold (Au) 252 over the Ag layer 251. Each elongate nanostructure 202 with the metal layer 220 may form a plasmonic nanostructure 224. The nanostructure arrangement 250 may further include a layer of metal 226, as a backreflector, at portions of the surface of the substrate 200 without the plurality of elongate nanostructures 202. As a non-limiting example, the metal layer 226 may include a layer of silver (Ag) 253, and a layer of gold (Au) 254 the Ag layer 253. In various embodiments, a single metal evaporation step may be performed to deposit the metal layers 220, 226.

As illustrated in FIG. 3, elongate nanostructures 202 and therefore also the plasmonic nanostructures 224 may have different cross sectional dimensions or diameters, d, and/or spacing, s, between adjacent nanostructures 202.

In various embodiments, each pixel or plixel 255, 256, may include four plasmonic nanostructures 224 that support particle resonances, although any number of plasmonic nanostructures 224 per plixel may be provided, for example one, two, three or any higher number of plasmonic nanostructures 224. As shown in FIG. 3, the metal nanodisks 220 are raised above equally sized nanoholes, where the bases of the elongate nanostructures 202 are located, on the backreflector 226. The backreflector plane 226 functions as a mirror to increase the scattering intensity of the metal nanodisks 220.

As a non-limiting example, FIG. 3 illustrates the interaction of white light, e.g. a combination of red wavelength light 260, green wavelength light 262 and blue wavelength light 264, with two closely spaced plixels 255, 266, each including four nanodisks 220 raised above the backreflector 226. As a result of the different diameters, d, and/or spacings, s, of the nanodisks 220 for the plixels 255, 256, different wavelengths of light may be preferentially reflected back. For example, the plixel 255 may be configured to reflect green wavelength light 262 while the plixel 256 may be configured to reflect red wavelength light 260. Therefore, colour information may be encoded in the diameter, d, of the nanoposts 202 and/or the spacing, s, between adjacent nanoposts 202.

It should be appreciated that the nanostructure arrangement 250 may include any number of plasmonic nanostructures 224 or metal nanodisks 220 per plixel and/or any number of plixels.

Figure 4A:
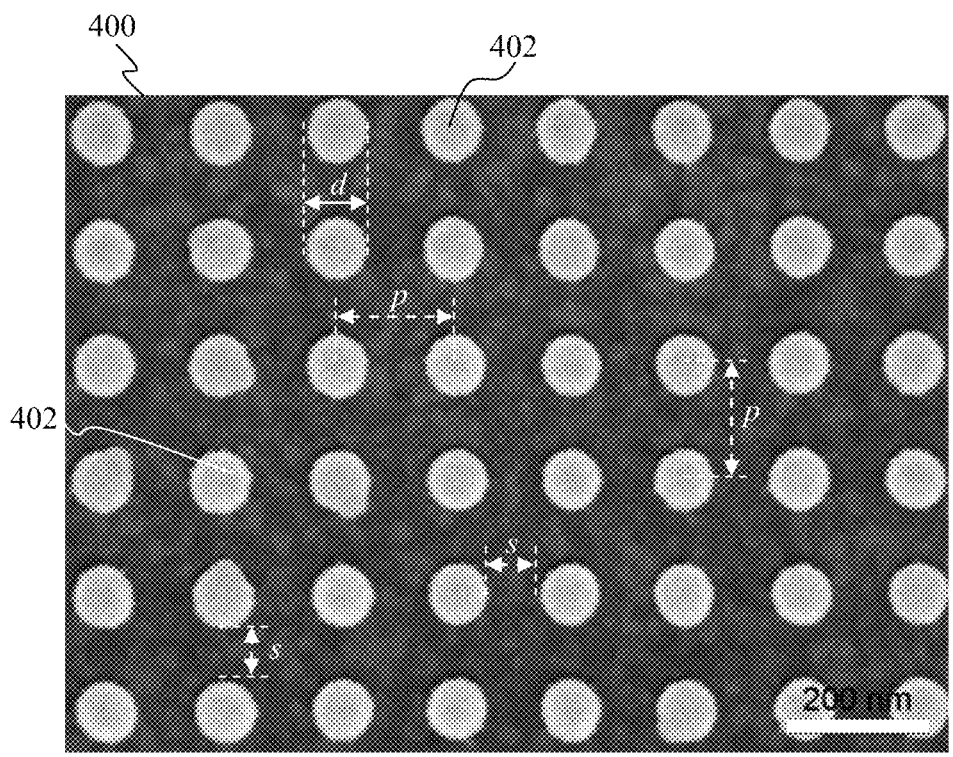
FIG. 4A shows a scanning electron micrography (SEM) image of a nanostructure arrangement, according to various embodiments. The scale bar represents 200 nm.

FIG. 4A shows a scanning electron micrography (SEM) image 400 of a nanostructure arrangement, according to various embodiments. The nanostructure arrangement includes a plurality of plasmonic nanostructures 402, e.g. a plurality of elongate nanostructures (e.g. nanoposts) having a thin metal layer (e.g. metal nanodisk) deposited on the top end of each elongate nanostructure. The plasmonic nanostructures 402, and therefore the plurality of elongate nanostructures and the metal nanodisks have circular cross sectional shapes. The cross sectional dimension (also diameter in this embodiment), d, of each elongate nanostructure, and also each metal nanodisk may be about 90 nm, while the spacing, s, between adjacent plasmonic nanostructures 402 may be about 80 nm, and the pitch, p, between adjacent plasmonic nanostructures 402 may be about 170 nm. However, it should be appreciated that other cross sectional shapes and/or cross sectional dimensions, d, and/or spacings, s, and/or pitches, p, may be possible.

While the plurality of plasmonic nanostructures 402, and therefore also the plurality of elongate nanostructures (e.g. nanoposts) are arranged in a uniform or regular pattern/configuration (e.g. periodic), as shown in FIG. 4A for example in a grid-like manner, it should be appreciated that the positioning of the plasmonic nanostructures 402 may be in a random manner while maintaining the spacing, s, between adjacent plasmonic nanostructures 402 at approximately equal distance.

Figure 4B:
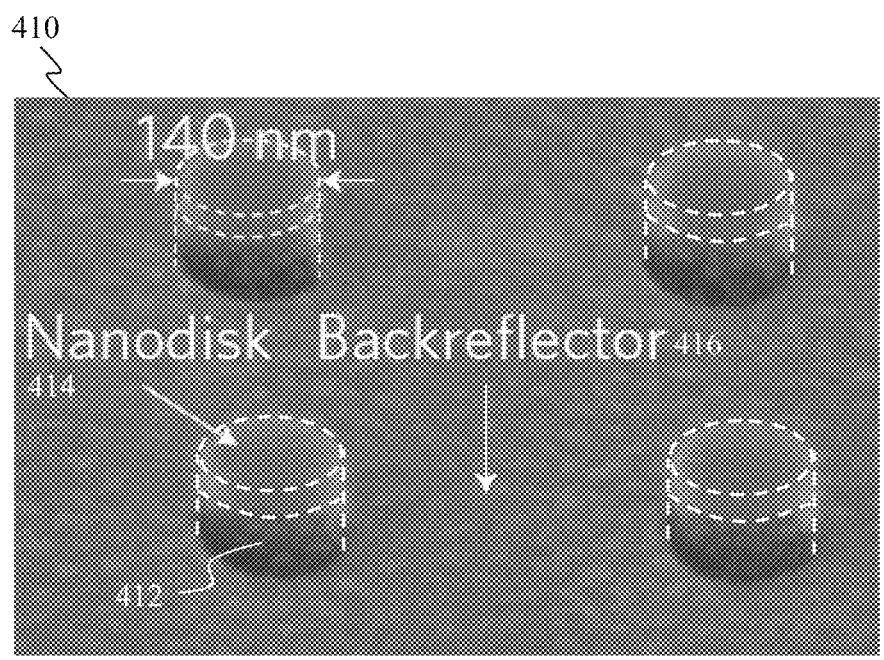
FIG. 4B shows a scanning electron micrography (SEM) image of a nanostructure arrangement, according to various embodiments.

FIG. 4B shows a scanning electron micrography (SEM) image 410 of a nanostructure arrangement, according to various embodiments, obtained at a 70° side-angle of a small area of the nanostructure arrangement. The nanostructure arrangement includes a plurality of elongate nanostructures 412, each coated with a nanodisk 414, and with a layer of backreflector 416.

In various embodiments, in order to achieve a full palette of colours that span the visible range, the diameters, d, of the metal nanodisks and also that of the elongate nanostructures, and/or the interdisk separations or equivalently the spacings, s, between adjacent elongate nanostructures, may be varied.

Figure 5A:
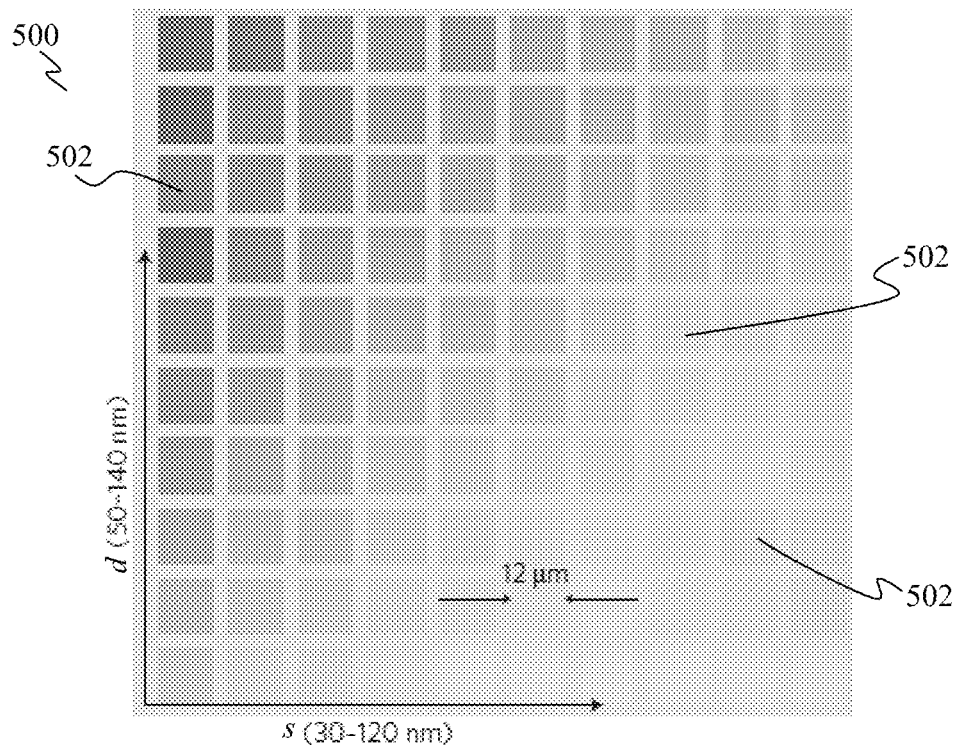
FIGS. 5A and 5B show optical micrographs, according to various embodiments.

FIG. 5A shows an optical micrograph 500 of arrays 502 of HSQ elongate nanostructures (or nanoposts), according to various embodiments. Each array 502 is a 12 μm square having a square lattice of nanoposts of periodicity (d+s). The diameter, d, of the nanoposts was varied between 50 nm and 140 nm from the bottom row to the top row of arrays 502, while the spacing, s, was varied between 30 nm and 120 nm from the left column to the right column of arrays 502. The arrays 502 of elongate nanostructures display grey-scale variations, without displaying any colour.

Figure 5B:
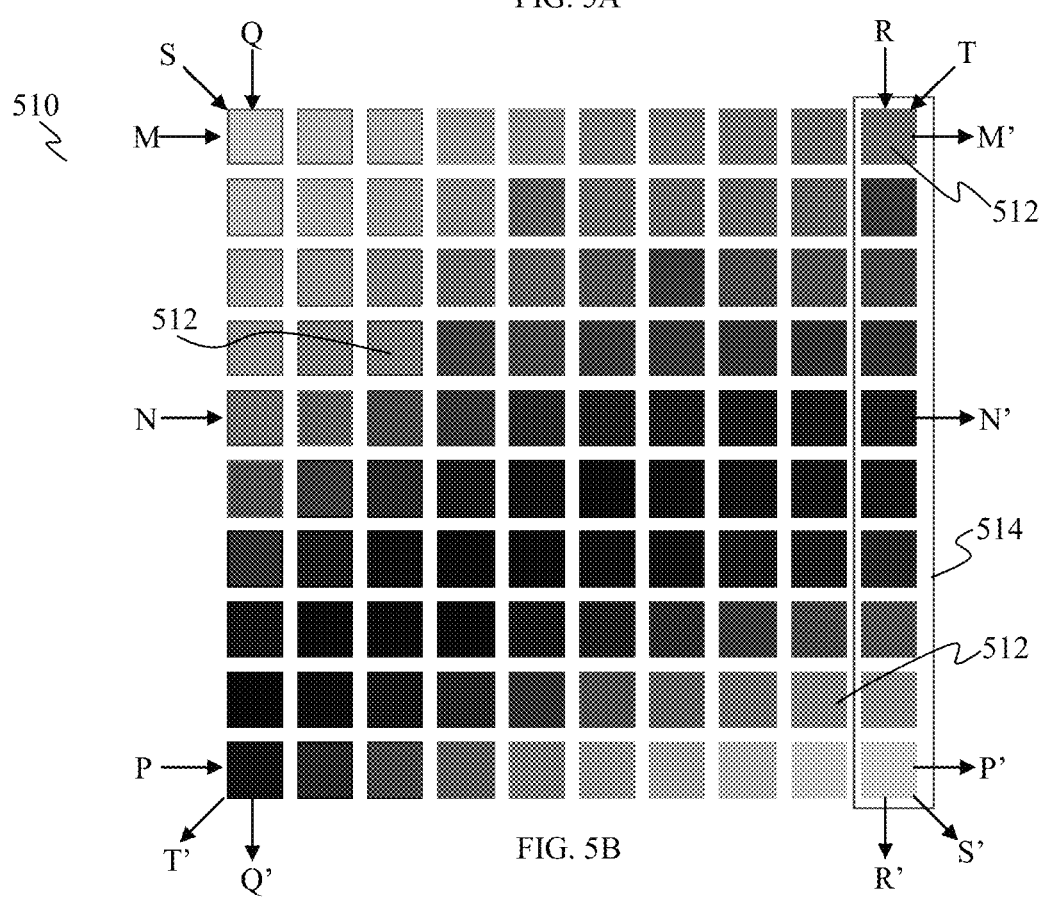

FIG. 5B shows an optical micrograph 510 of arrays 512 of plasmonic nanostructures, after deposition of a metal layer (e.g. about 1 nm Cr, about 15 nm Ag, about 5 nm Au) on top of each HSQ elongate nanostructure, according to various embodiments. The addition of metal layers of a uniform thickness transformed the grey-scale arrays of HSQ nanostructures as observed in FIG. 5A into a brilliant display of colour arrays 512 as in FIG. 5B (viewed using reflection bright-field microscopy).

For example, in the direction M→M', the colour changed from yellow to green, in the direction N→N', the colour changed from yellow to green to blue, in the direction P→P', the colour changed from dark brown to light brown (e.g. different shades of brown), in the direction Q→Q', the colour changed from yellow to green to blue to brown, in the direction R→R', the colour changed from green to blue to violet to brown, in the direction S→S', the colour changed from yellow to green to blue to brown, and in the direction T→T', the colour changed from green to blue to brown.

Following deposition of thin metal layers of a uniform thickness, the full palette of colours may be obtained. Nanostructure arrays with substantially similar or moderate change in colours may be observed in the direction T→T', indicating that arrays 512 with similar fill factors, (d/(d+s)), may produce arrays 512 of substantially similar colours. Nanostructures with the same periodicity, (d+s), may display a wide range of colours as may be observed in the direction S→S'.

From these arrays 512 of colours, three factors attest to the role of plasmon resonances in colour formation: (i) colours may be observed only upon the introduction of a metal layer on top of an elongate nanostructure; (ii) equiperiodic regions (constant d+s) traversing the arrays 512 diagonally in the direction S→S' may not exhibit the same colour (unlike light diffraction off periodic structures); and (iii) regions of a similar fill factor (d/(d+s)) may have similar colours (noticeably in the dark band going from the midpoint between T-T' and in the direction of T'), in accordance with the plasmon resonances operating close to the quasistatic limit, where retardation effects may be minimal and resonances are independent of size scaling.

Figure 5C:
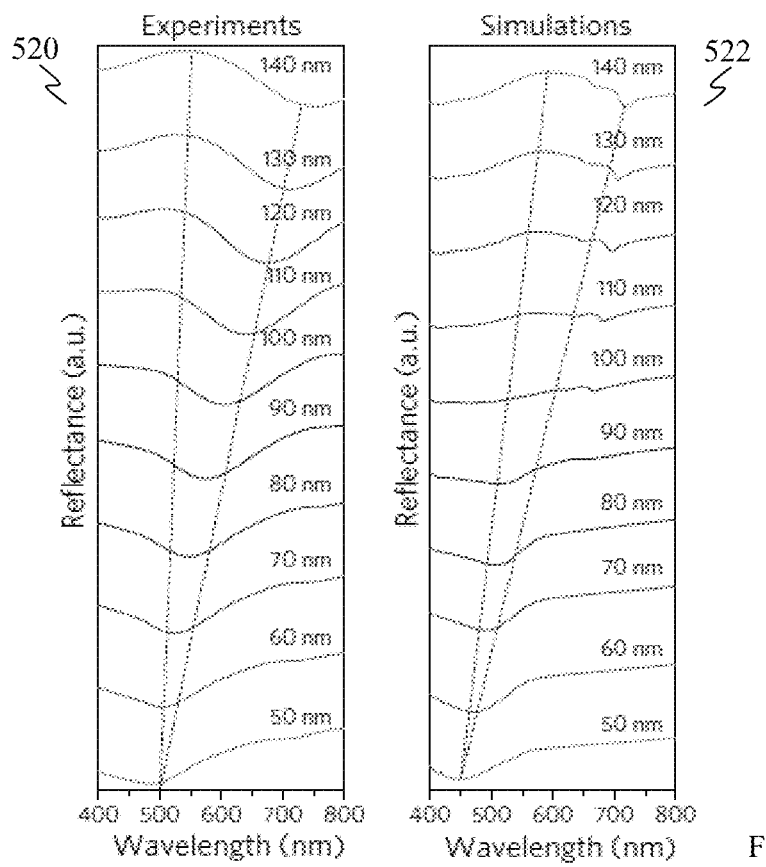
FIG. 5C shows measured and simulated reflectance spectra of metal nanodisks with a spacing, s, of 120 nm, according to various embodiments.
Figure 5D:
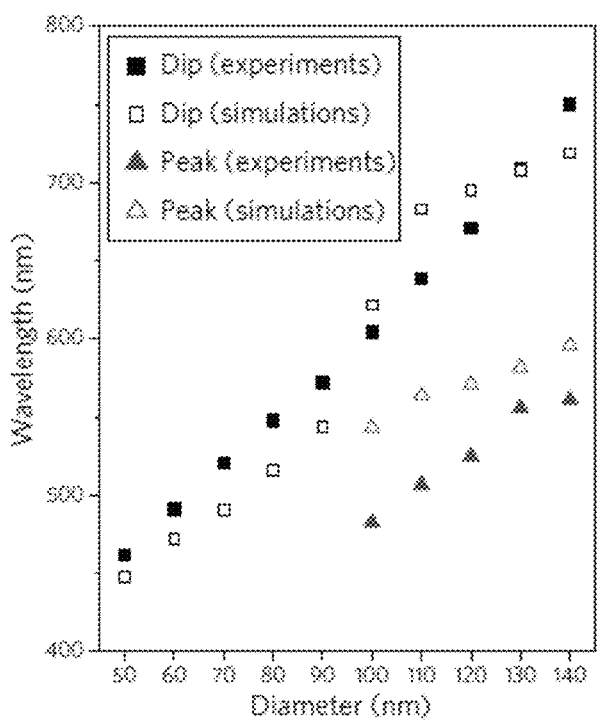
FIG. 5D shows a plot illustrating the correlation of the dips and peaks observed in the reflectance spectra of FIG. 5C, according to various embodiments.

FIG. 5C shows measured 520 and simulated 522 reflectance spectra of metal nanodisks with a spacing, s, of 120 nm, of the rightmost column (as indicated by the box 514) of arrays 512 in FIG. 5B, according to various embodiments. The measured reflectance spectra 520 exhibit peaks and dips that may be tuned across the visible spectrum by varying d and thus the periodicity (d+s). The simulated reflectance spectra 522 demonstrates a qualitative agreement with the corresponding measured reflectance spectra 520, as is further shown in FIG. 5D, where both peaks (triangles) and dips (squares) redshift with increasing diameter, d. The dotted trendlines shown in FIG. 5C approximate the movement of the peaks and dips with varying sizes or dimensions, d, of the plasmonic nanostructures.

Through simulations (results not shown), a subtle difference may be found in the origin of the spectral dips, observed in the reflectance spectra 520, 522, for d<100 nm when compared with larger nanodisks. The dips for smaller nanodisks may be due to power absorption by the nanodisks and, to a lesser extent, the backreflector. Together, the nanodisk, the elongate nanostructure and the backreflector may effectively act as an antireflection stack at the wavelength corresponding to the dip.

Conversely, the dips for larger nanodisks may be due to Fano resonances that result from the interference between the broad resonance of the nanoholes on the backreflector where plasmonic nanostructures are formed (i.e. the nanoholes at the base of the plasmonic nanostructures), and the nanodisks with the sharp resonance of the surface modes. Fano resonance is a type of resonant scattering phenomenon that gives rise to an asymmetric line-shape, due to interference between a background and a resonant scattering process. At this resonance condition, optical power flows around the nanodisks, through the nanoholes, and is absorbed by the backreflector and/or the substrate. The peaks observed in the reflectance spectra 520, 522, correspond to the plasmon resonances of the nanodisks, which intensify for larger nanodisks because of their increased scattering strengths.

In various embodiments, nanostructure arrangements having plasmonic nanostructures with a constant periodicity (d+s) may produce a range of colours, in contrast to nanoholes in a metal film, whose periodicity determines the optical resonance.

Figure 6:
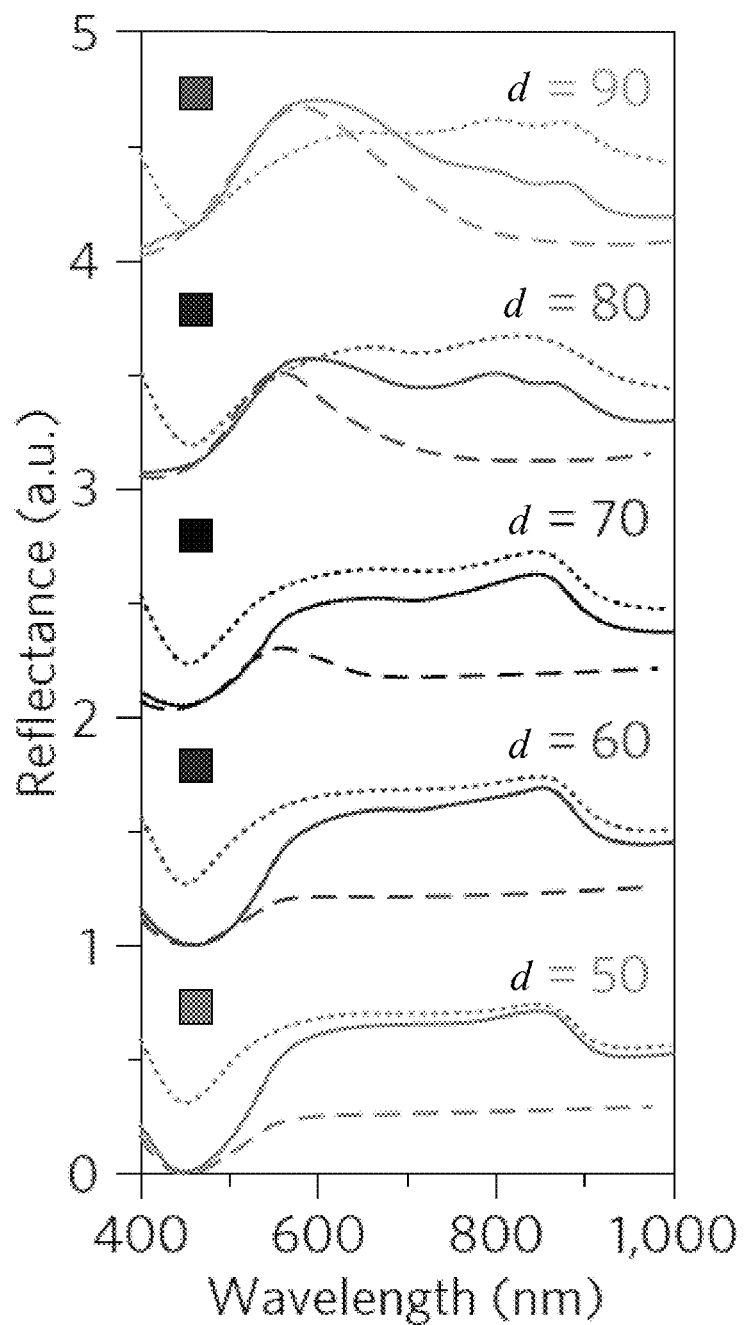
FIG. 6 shows simulated reflectance spectra of plasmonic nanostructures with a periodicity of 120 nm for different cross sectional dimensions, according to various embodiments.

FIG. 6 shows simulated reflectance spectra of plasmonic nanostructures with a periodicity, (d+s), of 120 nm for different cross sectional dimensions, d, according to various embodiments. Plasmonic nanostructures with d+s=120 nm and with different d exhibit different colours. For example, for d=50 nm, a light brown colour is observed, for d=60 nm, a dark brown colour is observed, for d=70 nm, a black colour is observed, for d=80 nm, a dark green colour is observed, and for d=90 nm, a light green colour is observed. These are represented by the respective square boxes corresponding to the respective d values.

In FIG. 6, solid lines show the reflectance spectra of a nanostructure arrangement with plasmonic nanostructures and a metal backreflector, dotted lines show the reflectance spectra of a nanostructure arrangement with elongate nanostructures, without metal nanodisks at the end of each elongate nanostructure, and with a metal backreflector, while dashed lines show the reflectance spectra of a nanostructure arrangement with plasmonic nanostructures, and without a metal backreflector.

The simulated reflectance spectra show that a nanostructure arrangement without the metal nanodisks or without a backreflector plane does not produce the corresponding colours observed as mentioned above. For a nanostructure arrangement without metal nanodisks (i.e. dotted lines), a fairly constant spectrum is obtained across arrays with the same periodicity, with a point of inflexion at about 900 nm indicating a Fano resonance profile, and a dip at about 450 nm that may be attributable to the elongate nanostructures and the metal backreflector effectively acting as an antireflection stack at this wavelength, as described earlier. In addition, the dip at 450 nm is observed to be invariant to a changing periodicity, (d+s). In other words, the absorbance at this region of about 450 nm is independent of periodicity. As shown in FIG. 6, the feature corresponding to the Fano resonance occurs at a constant wavelength of about 900 nm for all values of d from 50 nm to 90 nm.

For a nanostructure arrangement without a metal backreflector (i.e. dashed lines), a single peak is observed corresponding to the nanodisk plasmon resonance that blueshifts and intensifies with increasing d within a narrow spectral range between the wavelength, $\lambda$, of about 570 nm and about 590 nm.

As shown in FIG. 6, colour variation at constant periodicity may be achieved only for the optical arrangement with plasmonic nanostructures and a metal backreflector (i.e. solid lines), where, as the scattering strength of the nanodisks increases, the spectrum peak shifts in favour of the nanodisk resonance and away from the Fano resonance.

In various embodiments, each plixel (e.g. 255, 266, FIG. 3) may be shrunk to a size of approximately 250 nm×250 nm (0.0625 $\mu m^2$) and still be observable, for example using a microscope with an objective of about 100× (magnification factor of 100) and a numerical aperture (NA) of about 0.9. The value of 250 nm plixel pitch is given by the optical diffraction limit from the far-field observation of each individual plixel.

Figures 7A, 7B:
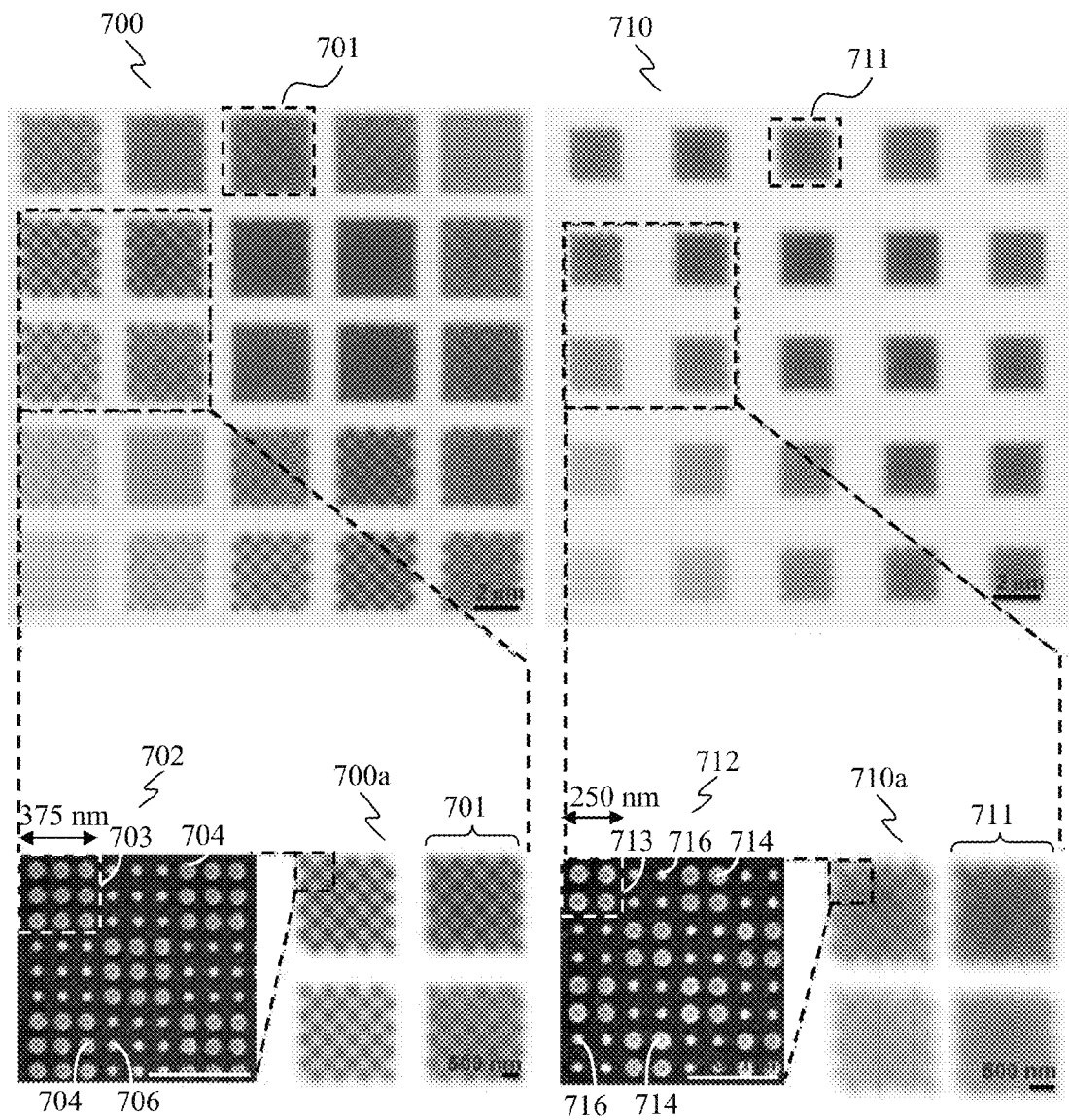
FIGS. 7A and 7B show sets of images of patterns of metallic nanostructures at the optical diffraction limit, according to various embodiments.

FIGS. 7A and 7B show sets of images of patterns of metallic nanostructures at the optical diffraction limit, according to various embodiments, illustrating that even though each individual plixel may be as small as about 250 nm, the plixels may still be reliably identified. A set of checkerboard resolution test structures with alternating colours (e.g. one colour being darker than the other) may be patterned, in order to demonstrate the colour pixel resolution at the optical diffraction limit.

FIG. 7A shows a brightfield reflection micrograph 700 (the scale bar represents 2 $\mu m$), a sectional brightfield reflection micrograph 700a (the scale bar represents 500 nm), and a scanning electron microscopy (SEM) image 702 (the scale bar represents 500 nm) of squares 701 of nanostructures, according to various embodiments. The brightfield reflection micrograph 700 may be obtained using an objective lens with 150× magnification and an NA of about 0.9. Each square 701 includes 64 patterns or plixels 703 of 3×3 nanostructures (e.g. plasmonic nanostructures 704, 706, having nanodisks) per plixel 703, with a plixel size of about 375 nm×375 nm. Each plixel 703 includes a nanostructure arrangement of 3×3 nanostructures. The SEM image 702 of a small region of the checkerboard pattern of a square 701 reveals the individual nanostructures 704, 706. As may be observed in FIG. 7A, the individual alternating colours, which are represented by the individual checks of the checkerboard pattern, defining individual plixels, may be clearly discernible.

FIG. 7B shows a brightfield reflection micrograph 710 (the scale bar represents 2 $\mu m$), a sectional brightfield reflection micrograph 710a (the scale bar represents 500 nm), and a scanning electron microscopy (SEM) image 712 (the scale bar represents 500 nm) of squares 711 of nanostructures, according to various embodiments. The brightfield reflection micrograph 710 may be obtained using an objective lens with 150× magnification and an NA of about 0.9. Each square 711 includes 64 patterns or plixels 713 of 2×2 nanostructures (e.g. plasmonic nanostructures 714, 716 having nanodisks) per plixel 713, with a plixel size of about 250 nm×250 nm. Each plixel 713 includes a nanostructure arrangement of 2×2 nanostructures. The SEM image 712 of a small region of the checkerboard pattern of a square 711 reveals the individual nanostructures 714, 716. As may be observed in FIG. 7B, the individual alternating colours, which are represented by the individual checks of the checkerboard pattern, defining individual plixels, may be clearly discernible.

As shown in FIGS. 7A and 7B, although the number of nanodisks per pixel is reduced from nine nanodisks or nine plamonic nanostructures 704, 706 (SEM image 702) to four nanodisks or four plamonic nanostructures 714, 716 (SEM image 712), the colour scheme of each chequerboard pattern may be preserved. The results shown in FIGS. 7A and 7B demonstrate the patterning of colour plixels at the optical diffraction limit. Therefore, the single plixels 703 of nine plamonic nanostructures 704, 706, and the single plixels 713 of four plamonic nanostructures 714, 716, may be able to support individual colours at the optical diffraction limit.

Figure 8:
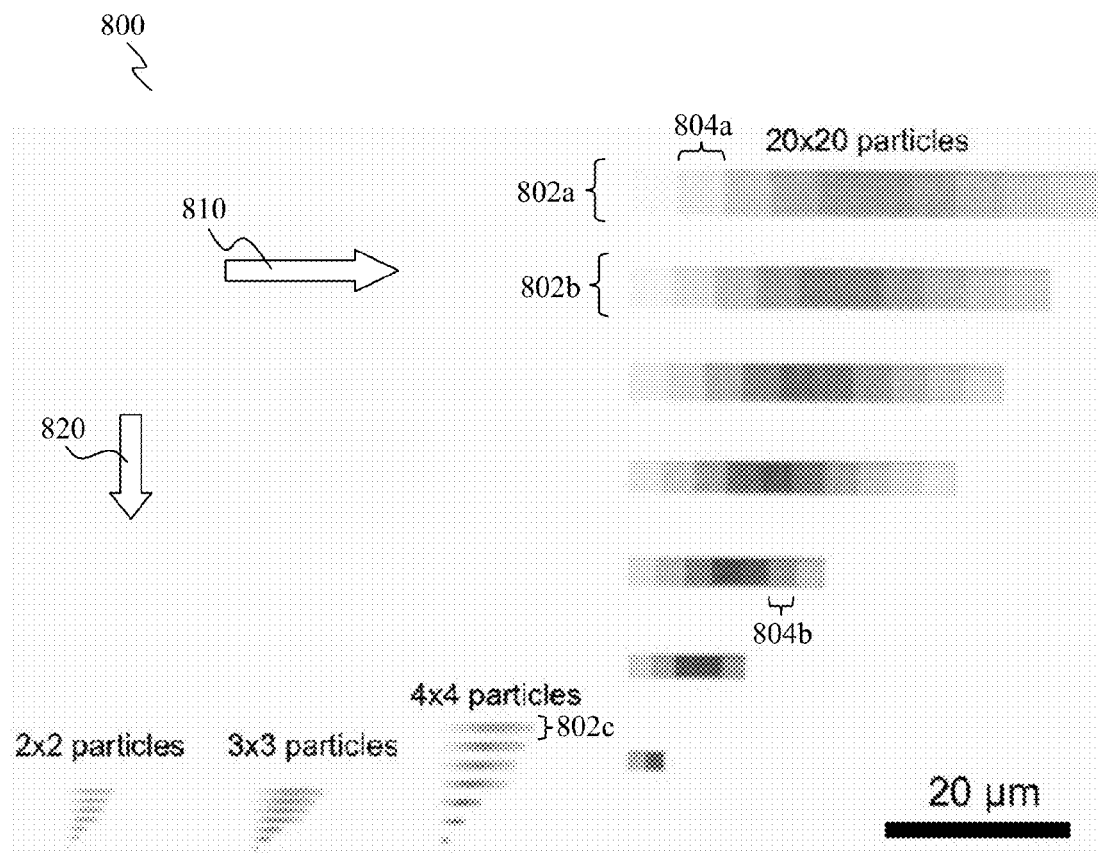
FIG. 8 shows an image illustrating tracks of individual plixels with different physical sizes, according to various embodiments.

FIG. 8 shows an image 800 illustrating tracks, e.g. 802a, 802b, 802c, of individual plixels, e.g. 804a, 804b, with different physical sizes, according to various embodiments. The image 800 was recorded using a 50× objective with a 0.8 NA to encompass all the structures within one frame. Each individual plixel includes 2×2 metal nanostructures, 3×3 metal nanostructures, 4×4 metal nanostructures, or 20×20 metal nanostructures. It may be observed that even when individual plixels are shrunk from a size of approximately 2.5 µm×2.5 µm (20×20 metallic nanostructures or particles) to approximately 250 nm×250 nm (2×2 metallic nanostructures or particles), the individual plixel colours may still be preserved and be observable. In the direction denoted by the arrow 810, the colour for a respective track, e.g. 802a, 802b, 802c, may change from pink to violet to blue to green to yellow, or partially thereof. In the image 800, the size per plixel for each respective result set corresponding to 2×2 metal nanostructures, 3×3 metal nanostructures, 4×4 metal nanostructures, or 20×20 metal nanostructures is reduced in the direction denoted by the arrow 820.

The use of plixels of various embodiments as an optical method to store data will now be described, with comparison against the conventional methods.

Typical data storage processes use a binary algorithm to store data. In the case of optical data storage such as compact discs (CD), digital video discs (DVD) and Blu-ray disks, the data is written as a series of pits and flat areas within tracks with a pitch of 320 nm, where the inside of the each pit is the '0' or 'off' state, and the flat areas denote the '1' or 'on' state. The presence of a pit is detected via the reflection of lasers off the pits and flat areas, and in the case of Blu-ray, via blue lasers (shortest optical wavelength, resulting in pit sizes of 150 nm).

Figure 9:
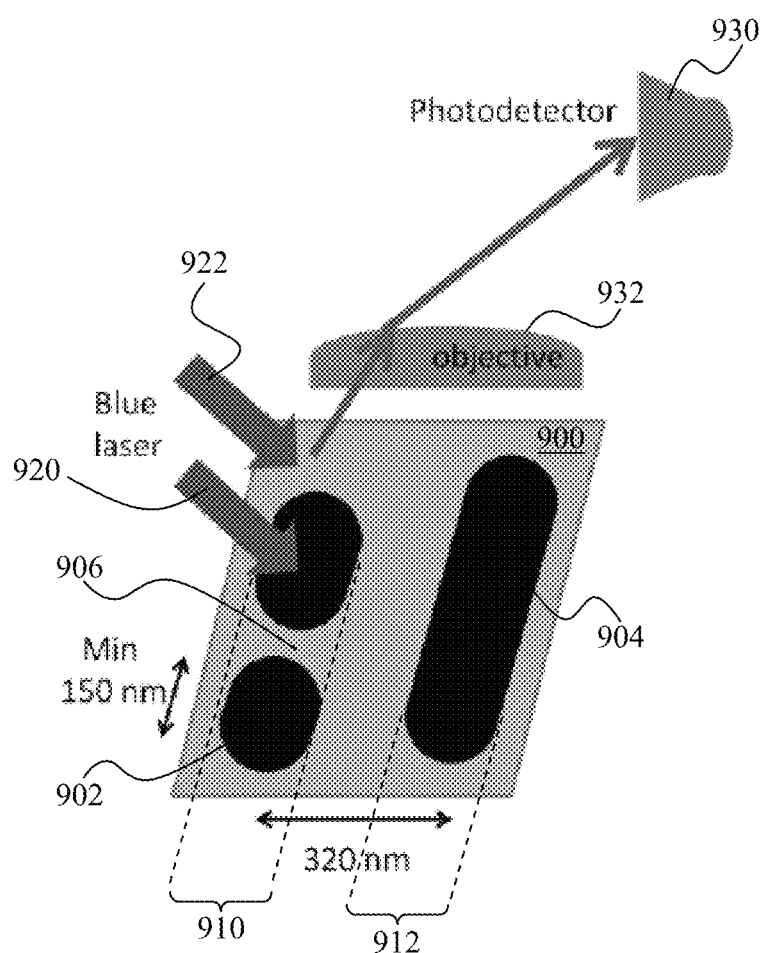
FIG. 9 shows a schematic sectional representation of a Blu-ray disc.

FIG. 9 shows a schematic sectional representation of a Blu-ray disc 900, illustrating the pits, e.g. as represented by the dark shades 902, 904, and the flat areas, e.g. 906. The pits, e.g. 902, 904, and the flat areas, e.g. 906, may be arranged in tracks that run in a circular fashion around the disc 900, in a direction from the inner portion of the disc 900 towards the outer portion or diameter of the disc 900. As an example, the pit 902 and the flat area 906 may be arranged along a track 910, while the pit 904 may be arranged in an adjacent track 912. The track pitch, between adjacent tracks, e.g. 910 and 912, may be about 320 nm, while the minimum pit size may be about 150 nm. A blue laser may be shone on the sample track, e.g. 910. When light, as represented by the arrow 920, from the blue laser encounters a pit, there is no reflection, while when light, as represented by the arrow 922, from the blue laser encounters a flat area, a reflection from the flat area may be observed and recorded by a photodetector 930 via an objective lens 932.

Through a combination of the '0s' (pits) and '1s' (flat areas), it is possible to encode strings of data into a track, e.g. 910, 912, on the disc 900. Allowing for parity checking, which is necessary to ensure that data is read in the correct order, the densest optical data storage platform, the Blu-ray, can store up to 25 GB of information per layer. Currently, up to 4-layer Blu-ray discs are available, while 6-layer disks have been demonstrated. This large amount of data is seen as vital for the storage and play-back of high-definition movies.

In general, the total number of states, S, that may be stored by a particular module or medium may be calculated by $S=x^y$, where x represents the number of states that may be represented by 1 data element, and y represents the number of data elements available. As an example using 1 Byte of information based on the binary system, 1 Byte is a unit of data that is eight binary digits (bits) long. Therefore, there are eight data elements (i.e. y=8) for 1 Byte of information, where each data element is equivalent to one bit. As there are two states or values ("0", "1") per bit or equivalently data element, x=2. Accordingly, 1 Byte of information in binary coding may represent $S=2^8=256$ total states.

The current approach in optical data storage has been to increase the number of data elements in a given position or area, thereby increasing y, by shrinking the data elements to the smallest possible size. This limit has been reached by the Blu-ray technology.

In various embodiments, by representing each state or value by a single plixel, the number of states that may be stored per data element may be increased, thereby increasing x. This increase in the number of states, x, per data element may be achieved through the use of metallic nanostructures or plasmonic nanostructures as described herein that may produce a variety of distinct colours with distinct signals or spectra, for example within a space or area of approximately $0.0625$ µm$^2$, which is the optical diffraction limit for a microscope with an objective of 100× and an NA of 1 (wavelength ~500 nm, midspectrum). On an average Blu-ray disk (diameter, $\phi=12$ cm), this may translate to approximately $1.81\times10^{11}$ data elements. In binary coding, this translates to approximately 21.6 GB per layer per disc.

In various embodiments, as a non-limiting example, the consequence of such an increase in the number of states is that the area which is necessary to store a total of 256 states (1 Byte) may now potentially store $4^8$ or 65536 states with the introduction of 4 states per data element (x=4). This corresponds to an increase in data storage by two times (2×) to approximately 43.2 GB per layer (e.g. storage layer) per disk.

Figure 10:
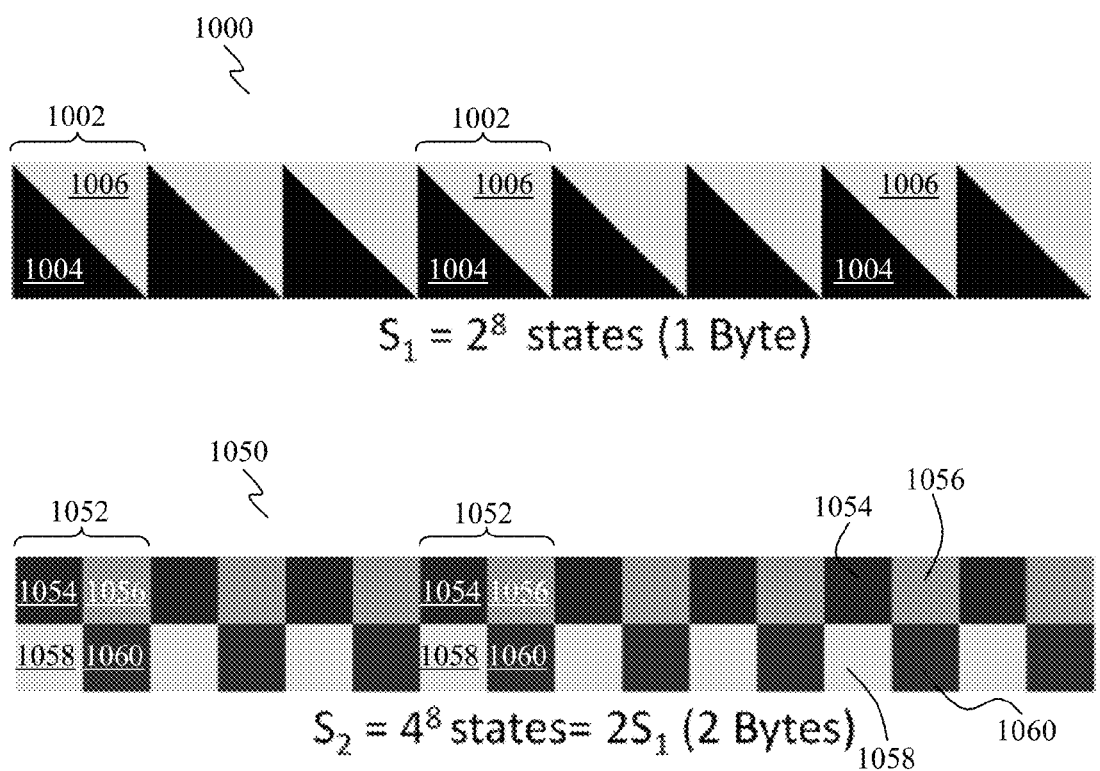
FIG. 10 shows schematic representations of a conventional optical data storage and the method of data storage of various embodiments.

In various embodiments, by controlling the plixel color that may be viewable in an optical microscope, the amount of data being stored in a particular position may be massively increased. FIG. 10 shows schematic representations of a conventional optical data storage, based on binary states as illustrated by the binary system 1000, and the method of data storage of various embodiments, based on quaternary states as a non-limiting example as illustrated by the quaternary system 1050, respectively, for example for optical storage layers. Conventional binary data storage involves the use of bits which may be switched between '0' and '1'.

The binary system 1000 may include a plurality of data elements, as represented by 1002 for two such data elements, where each data element 1002 may have two possible states or values, for example as respectively represented by a dark area 1004 and a light area 1006. A dark area 1004 may represent the "0" state while A light area 1006 may represent the "1" state. It should be appreciated that while a dark area 1004 and a light area 1006 are simultaneously illustrated for each data element 1002, at any time, depending on the state for a particular data element 1002, the entire data element may either be a dark area 1004 to represent the "0" state or a light area 1006 to represent the "1" state. This may mean for example that a data element 1002 may be entirely a dark area 1004 when the data element has a "0" value. The simultaneous illustration of the dark area 1004 and the light area 1006 in two halves for each data element 1002 is merely to illustrate the two possible states or values that a data element 1002 may take, and not that each data element is divided into a dark area 1004 and a light area 1006. As shown in FIG. 10, arraying 8 bits together forms 1 Byte ($2^8$ states) of data.

The quaternary system 1050 may include a plurality of data elements, as represented by 1052 for two such data elements, where each data element 1052 may have four possible individual states or values, for example as respectively represented by a top-left dark area 1054, a top-right light area 1056, a bottom-left light area 1058 and a bottom-right dark area 1060. Similarly as described for the binary system 1000, it should be appreciated that while four coloured areas 1054, 1056, 1058, 1060 are simultaneously illustrated for each data element 1052, at any time, depending on the state for a particular data element 1002, the entire data element 1052 may be completely filled with one of the four coloured areas 1054, 1056, 1058, 1060 to represent one state (or value) out of four possible states that the data element 1052 may take. This may mean for example that a data element 1052 may be entirely a dark area 1054 to represent one state or value, or a light area 1058 to represent another state or another value.

While not clearly shown, each of the four areas 1054, 1056, 1058, 1060 is defined by a plixel having a nanostructure arrangement that is configured to reflect light of a particular wavelength, in response to an incident light irradiated thereon, that is different from the respective lights reflected by the other three nanostructure arrangements of the other three plixels. As shown in FIG. 10, as a result of the quaternary states defined by four plixels respectively, arraying of 8 quaternary data elements 1052 result in 2 Bytes of data ($4^8$ states) in the same space or area occupied by 1 Byte previously for the binary system 1000.

Various embodiments of optical storage may be extended infinitely as long as each individual state may be reliably distinguished from each other. Therefore, an n-ary case or system may be achieved as long as the individual states may be clearly distinguished or individually distinguished from each other. As a non-limiting example, the number of states may be extended to include 16 possible states for one data element, which may lead to an increase in data storage by four times (4×), to approximately 86.4 GB per layer per disc.

In various embodiments, the amount of data that may be stored per disc or storage medium may be increased by increasing the number of storage layers per disc. For example, 2, 3, 4 or any higher number of storage layers may be provided for one disc.

In various embodiments, in order to achieve a higher amount of data or information that may be stored in a disc, beyond the amount of 86.4 GB per layer achieved using 16 states per data element, the number of layers (storage layers) patterned onto a single disk or storage medium may be increased. For example, a disc having 6 storage layers may potentially achieve or allow approximately 500 GB per disc.

Figure 11:
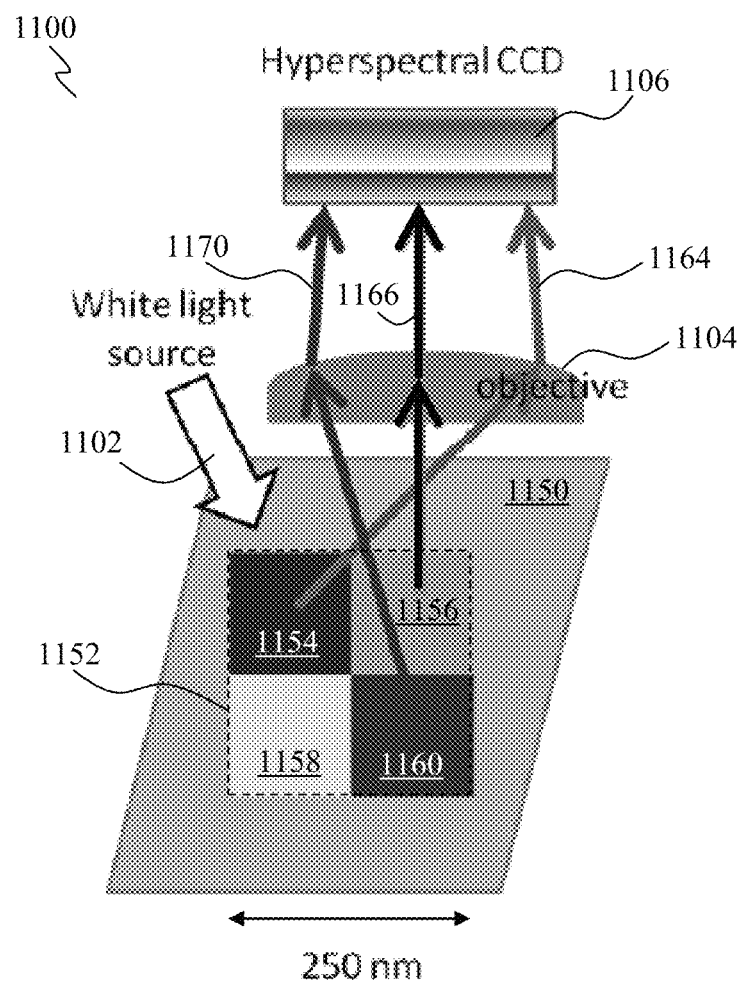
FIG. 11 shows a schematic representation of an optical data storage assembly, according to various embodiments.

In various embodiments, to enable the read-out of such dense data, it is necessary to be able to distinguish the spectrum of each pixel (or individual signal from each plixel) individually. FIG. 11 shows a schematic representation of an optical data storage assembly 1100, according to various embodiments, illustrating how data coded using plixels may be read. For ease of understanding and clarity, only a single data element 1152 on a section of a disc or storage medium 1150, is shown. As described in the context of FIG. 10, the data element may entirely be represented by one of four plixels 1154, 1156, 1158, 1160 respectively representing the four possible individual states that the data element 1152 may take. The optical data storage assembly 1100 may include a white light source for shining or irradiating white light, as represented by the arrow 1102, onto the plixel of the data element 1152.

As non-limiting examples, in embodiments where the entire data element 1152 includes the plixel 1154 having a respective nanostructure arrangement, the plixel 1154 may reflect light (e.g. blue light), as represented by the arrow 1164, in response to the white light 1102 irradiated onto the data element 1152, so as to represent one state. In embodiments where the entire data element 1152 includes the plixel 1156 having a respective nanostructure arrangement, the plixel 1156 may reflect light (e.g. green light), as represented by the arrow 1166, in response to the white light 1102 irradiated onto the data element 1152, so as to represent another state. In embodiments where the entire data element 1152 includes the plixel 1160 having a respective nanostructure arrangement, the plixel 1160 may reflect light (e.g. red light), as represented by the arrow 1170, in response to the white light 1102 irradiated onto the data element 1152, so as to represent a further state. Accordingly, depending on the state or value that a data element 1152 may have, a particular nanostructure arrangement defining a plixel may be provided so as to reflect a light of a particular wavelength to represent the desired state of the data element 1152, in response to irradiation by a white light. In this way, an image of the plixel array of a plurality of data elements may be generated from the respective reflected lights.

The optical data storage assembly 1100 may further include a high NA (e.g. ≥0.7) and high magnification (e.g. 50) objective 1104 for focusing the image of the plixel array or disc onto a detector 1106. In various embodiments, the detector 1106 may be a hyperspectral charge-coupled device (CCD) so as to distinguish the spectrum from each plixel 1154, 1156, 1158, 1160 individually. To further separate the individual signals being read out, a fine grating may be provided between the objective 1104 and the hyperspectral CCD 1106 to distinguish or resolve the individual signals.

Various embodiments may also offer the possibility of reading out the entire dataset of plixels at once or at least substantially simultaneously, which may be placed in a buffer (e.g. memory), which would be faster than the current track-based read-out of data.

The minimum distance between 2 colour features such that each feature is still resolvable in the farfield may be governed by the optical diffraction limit, which may be dependent on the wavelength of light and the type of equipment used to observe these colour features. As described above, a small group or arrangement of metal nanostructures or plasmonic nanostructures (e.g. 1-4 nanostructures, herein referred to as "plixel"), as defined by their sizes and/or separations, may be used to create colour pixels juxtaposed at the diffraction limit of light, allowing for the maximum number of colour features within a given space or area. Given that each plixel may potentially display multiple colour states, these plixels may be used to store data. Using the structures as described herein, analogous to a binary system of storage where 2 states may be stored, various embodiments may be able to store n-ary states, where n is the number of unique colours that may be defined within a plixel.

In contrast to a binary system with 2 states, in a quaternary system with 4 states, the amount of data stored in the same space as for the binary system may be doubled. With 8 states, the amount of data stored as for the binary system may be tripled. With n states, [ln(n)/ln(2)] times the data stored with a binary system may be achieved within the same space for the binary system of storage.

In various embodiments, the amount of data stored may be further increased by the use of a polarization-sensitive plixel, for example by using asymmetrical structures such as rods and ellipses instead of symmetrical structures such as disks.

A readout of the data may be achieved using white light illumination of the individual plixels. Individual plixels may subsequently be distinctly distinguished by a hyperspectral CCD setup.

In various embodiments, the optical data storage medium may be a non-rewritable optical data storage medium.

In various embodiments, the data may be stored in the optical data storage medium at the point of forming or manufacturing the optical data storage medium. This may mean that the plurality of nanostructure arrangements are formed on the optical data storage medium at the time of manufacturing the optical data storage medium.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method of writing to an optical data storage medium, the method comprising:
   receiving a plurality of data elements, each data element having one of a plurality of values, wherein each value of the plurality of values is associated with a wavelength and wherein different wavelengths represent different values of the plurality of values; and
   forming, for each data element, a plasmonic nanostructure arrangement on the optical data storage medium, the plasmonic nanostructure arrangement configured to reflect light of the wavelength associated with the value of the data element in response to a light irradiated on the optical data storage medium;
   wherein forming the plasmonic nanostructure arrangement for each data element comprises:
      forming one or more spaced apart elongate nanostructures extending from a surface of a substrate of the optical data storage medium;
      forming a metal layer on the end of each elongate nanostructure distal from the surface of the substrate, wherein each elongate nanostructure and the metal layer form a plasmonic nanostructure; and
      forming another metal layer on portions of the surface of the substrate without the one or more spaced apart elongate nanostructures so that the other metal layer on the portions of the surface of the substrate and the metal layer on the end of each elongate nanostructure extending from the surface of the substrate are discontinuous from each other.

2. The method as claimed in claim 1,
   wherein receiving a plurality of data elements comprises receiving at least two data elements having different values, and
   wherein forming a plasmonic nanostructure arrangement for each data element comprises forming, for each data element of the at least two data elements, one or more spaced apart elongate nanostructures having a cross sectional dimension defined along a transverse axis of the elongate nanostructures that is different from the one or more spaced apart elongate nanostructures of the nanostructure arrangements of the other of the at least two data elements.

3. The method as claimed in claim 2, wherein the cross sectional dimension is between about 10 nm and about 250 nm.

4. The method as claimed in claim 1,
   wherein receiving a plurality of data elements comprises receiving at least two data elements having different values, and
   wherein forming a plasmonic nanostructure arrangement for each data element comprises forming, for each data element of the at least two data elements, a plurality of spaced apart elongate nanostructures having a spacing between adjacent elongate nanostructures of the plurality of elongate nanostructures that is different from the plurality of spaced apart elongate nanostructures of the nanostructure arrangements of the other of the at least two data elements.

5. The method as claimed in claim 4, wherein the spacing between adjacent elongate nanostructures is between about 20 nm and about 300 nm.

6. The method as claimed in claim 1, wherein each elongate nanostructure has an asymmetrical cross sectional shape defined along a transverse axis of the elongate nanostructure.

7. The method as claimed in claim 1, wherein each elongate nanostructure has an at least substantially symmetrical cross sectional shape defined along a transverse axis of the elongate nanostructure.

8. The method as claimed in claim 1, wherein forming one or more spaced apart elongate nanostructures comprises forming a plurality of spaced apart elongate nanostructures arranged in a grid-like pattern.

9. The method as claimed in claim 1, wherein forming one or more spaced apart elongate nanostructures comprises forming between one elongate nanostructure and 400 spaced apart elongate nanostructures.

10. The method as claimed in claim 1, wherein a height of each elongate nanostructure is between about 10 nm and about 500 nm.

11. The method as claimed in claim 1, wherein a thickness of the metal layer on the end of each elongate nanostructure is between about 5 nm and about 100 nm.

12. The method as claimed in claim 1, wherein the metal layer comprises a metal selected from the group consisting of gold, silver, copper, aluminium, chromium, ruthenium, rhodium, palladium, osmium, iridium, platinum and any combination thereof.

13. The method as claimed in claim 1, wherein each plasmonic nanostructure arrangement has a size of between about 250 nm×250 nm and about 2.5 µm×2.5 µm.

14. A method of reading from an optical data storage medium, the method comprising:

irradiating a light on a plurality of plasmonic nanostructure arrangements on the optical data storage medium; and for each plasmonic nanostructure arrangement, determining the wavelength of the light reflected by the plasmonic nanostructure arrangement and determining the value of a data element for the plasmonic nanostructure arrangement based on the determined wavelength;

wherein the plasmonic nanostructure arrangement comprises:
one or more spaced apart elongate nanostructures extending from a surface of a substrate of the optical data storage medium;
a metal layer on the end of each elongate nanostructure distal from the surface of the substrate, wherein each elongate nanostructure and the metal layer form the plasmonic nanostructure; and
another metal layer on portions of the surface of the substrate without the one or more spaced apart elongate nanostructures so that the other metal layer on the portions of the surface of the substrate and the metal layer on the end of each elongate nanostructure extending from the surface of the substrate are discontinuous from each other.

15. The method as claimed in claim 14, wherein irradiating a light on a plurality of plasmonic nanostructure arrangements comprises irradiating a white light on the plurality of plasmonic nanostructure arrangements.

16. The method as claimed in claim 14, further comprising focusing the light reflected by the plasmonic nanostructure arrangement prior to determining the wavelength of the light.

17. The method as claimed in claim 14, further comprising separating the respective lights reflected by the plurality of plasmonic nanostructure arrangements prior to determining the wavelength of the light reflected by each plasmonic nanostructure arrangement.

18. An optical data storage medium comprising:
a substrate; and
a plurality of plasmonic nanostructure arrangements formed on the substrate,
wherein each plasmonic nanostructure arrangement of the plurality of plasmonic nanostructure arrangements comprises a plurality of spaced apart elongate nanostructures extending from a surface of the substrate, wherein each elongate nanostructure comprises a metal layer on the end distal from the surface of the substrate, and wherein each elongate nanostructure and the metal layer form a plasmonic nanostructure,
wherein each plasmonic nanostructure arrangement defines a data element having one of a plurality of values, wherein each value of the plurality of values is associated with a wavelength, and wherein different wavelengths represent different values of the plurality of values,
wherein each plasmonic nanostructure arrangement is configured to reflect light of the wavelength associated with the value of the data element in response to a light irradiated on the optical data storage medium; and
wherein each plasmonic nanostructure arrangement comprises:
one or more spaced apart elongate nanostructures extending from a surface of a substrate of the optical data storage medium;
a metal layer on the end of each elongate nanostructure distal from the surface of the substrate, wherein each elongate nanostructure and the metal layer form the plasmonic nanostructure; and
another metal layer on portions of the surface of the substrate without the one or more spaced apart elongate nanostructures so that the other metal layer on the portions of the surface of the substrate and the metal layer on the end of each elongate nanostructure extending from the surface of the substrate are discontinuous from each other.

* * * * *